United States Patent
Kim et al.

(10) Patent No.: US 8,692,349 B2
(45) Date of Patent: Apr. 8, 2014

(54) SEMICONDUCTOR DEVICES AND METHODS OF CONTROLLING TEMPERATURE THEREOF

(75) Inventors: Jae Choon Kim, Hwasung (KR); Eunseok Cho, Hwasung (KR); Mi-Na Choi, Hwasung (KR); Kyoungsei Choi, Hwasung (KR); Heejung Hwang, Hwasung (KR); Seran Bae, Hwasung (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 100 days.

(21) Appl. No.: 13/240,574

(22) Filed: Sep. 22, 2011

(65) Prior Publication Data

US 2012/0133427 A1 May 31, 2012

(30) Foreign Application Priority Data

Nov. 26, 2010 (KR) ........................ 10-2010-0118954

(51) Int. Cl.
*H01L 31/058* (2006.01)

(52) U.S. Cl.
USPC ........ 257/467; 257/414; 257/E23.08; 438/48; 438/54; 438/55

(58) Field of Classification Search
None
See application file for complete search history.

(56) References Cited

U.S. PATENT DOCUMENTS

| | | | | |
|---|---|---|---|---|
| 2006/0267170 A1* | 11/2006 | Sutardja | | 257/678 |
| 2007/0064768 A1* | 3/2007 | Taylor | | 374/170 |
| 2008/0251910 A1* | 10/2008 | Chang et al. | | 257/712 |
| 2009/0140369 A1* | 6/2009 | Lee | | 257/467 |
| 2009/0285261 A1* | 11/2009 | Casey et al. | | 374/178 |

FOREIGN PATENT DOCUMENTS

| | | | |
|---|---|---|---|
| JP | 9-116268 A | | 5/1997 |
| JP | 2007158228 A | | 6/2007 |
| JP | 2007158228 A | * | 6/2007 |
| KR | 20090056594 A | | 6/2009 |

* cited by examiner

*Primary Examiner* — Julio J Maldonado
*Assistant Examiner* — Joseph Galvin, III
(74) *Attorney, Agent, or Firm* — Harness, Dickey & Pierce, P.L.C.

(57) ABSTRACT

An example embodiment relates to a semiconductor device including a semiconductor package in which a semiconductor chip is mounted on the package substrate. The semiconductor package may include a temperature measurement device and a temperature control circuit. The temperature measurement device may measure a temperature of the semiconductor package. The temperature control circuit may change an operation speed of the semiconductor package on the basis of the temperature of the semiconductor package measured by the temperature measurement device.

35 Claims, 26 Drawing Sheets

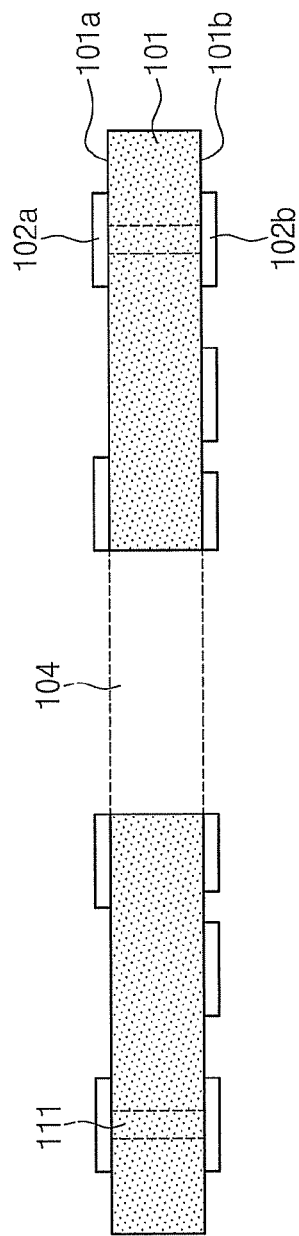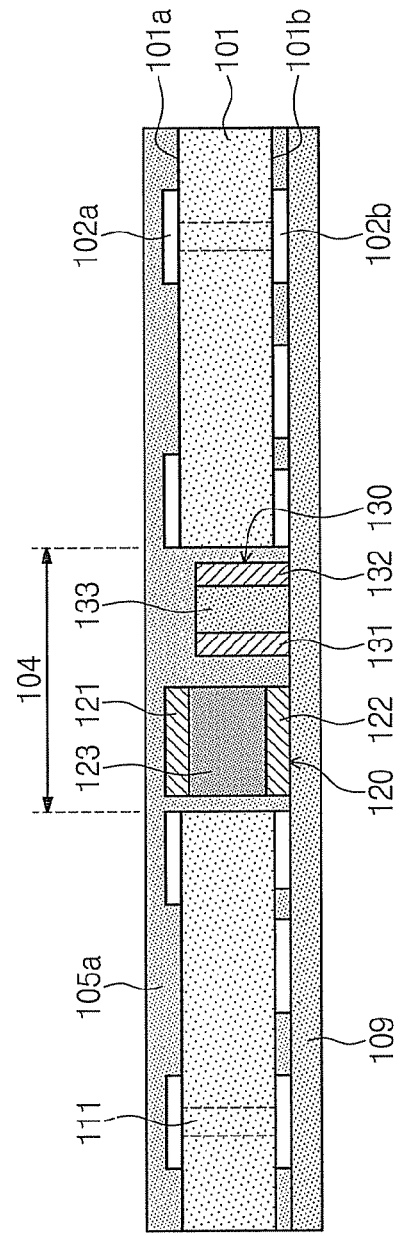

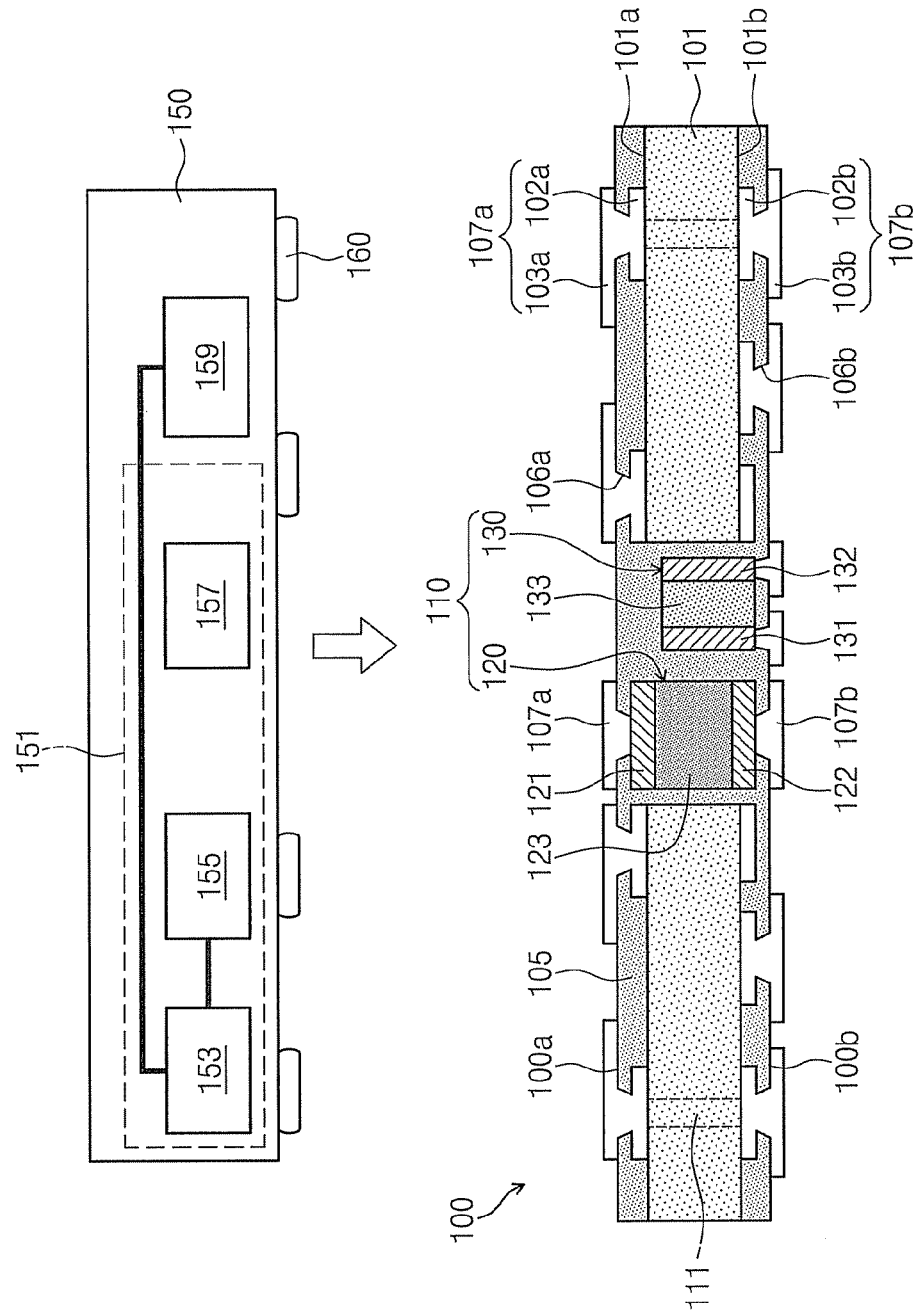

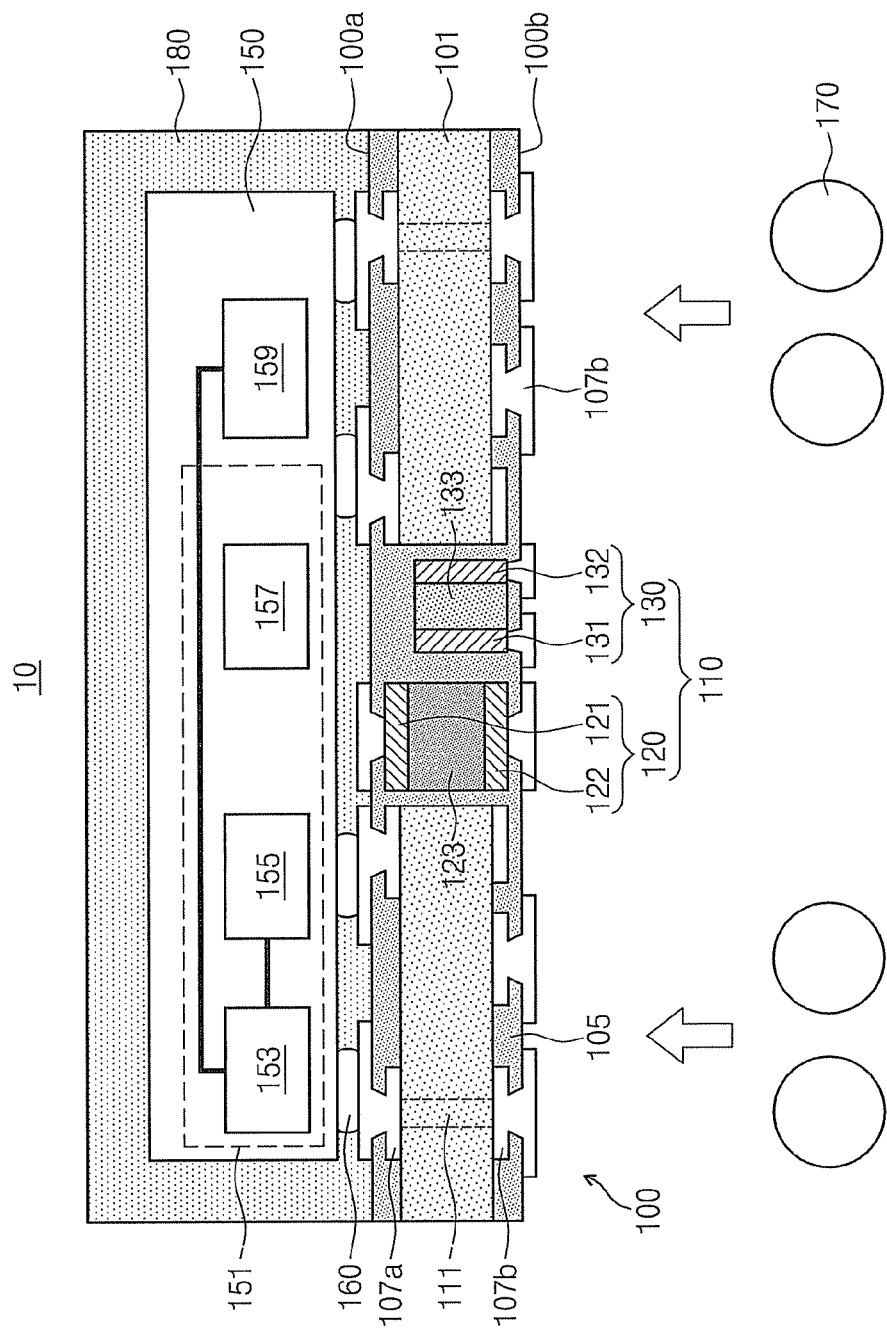

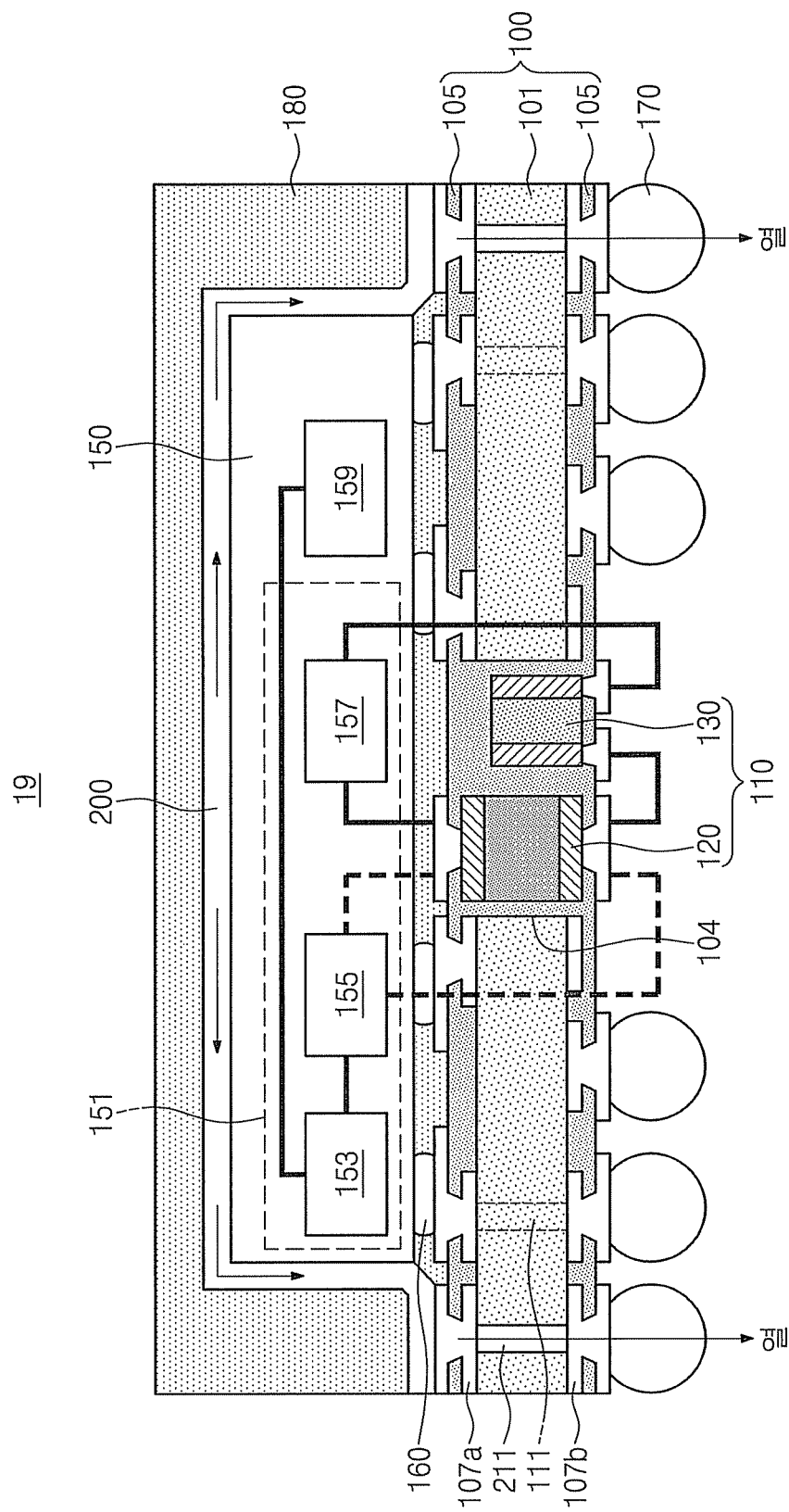

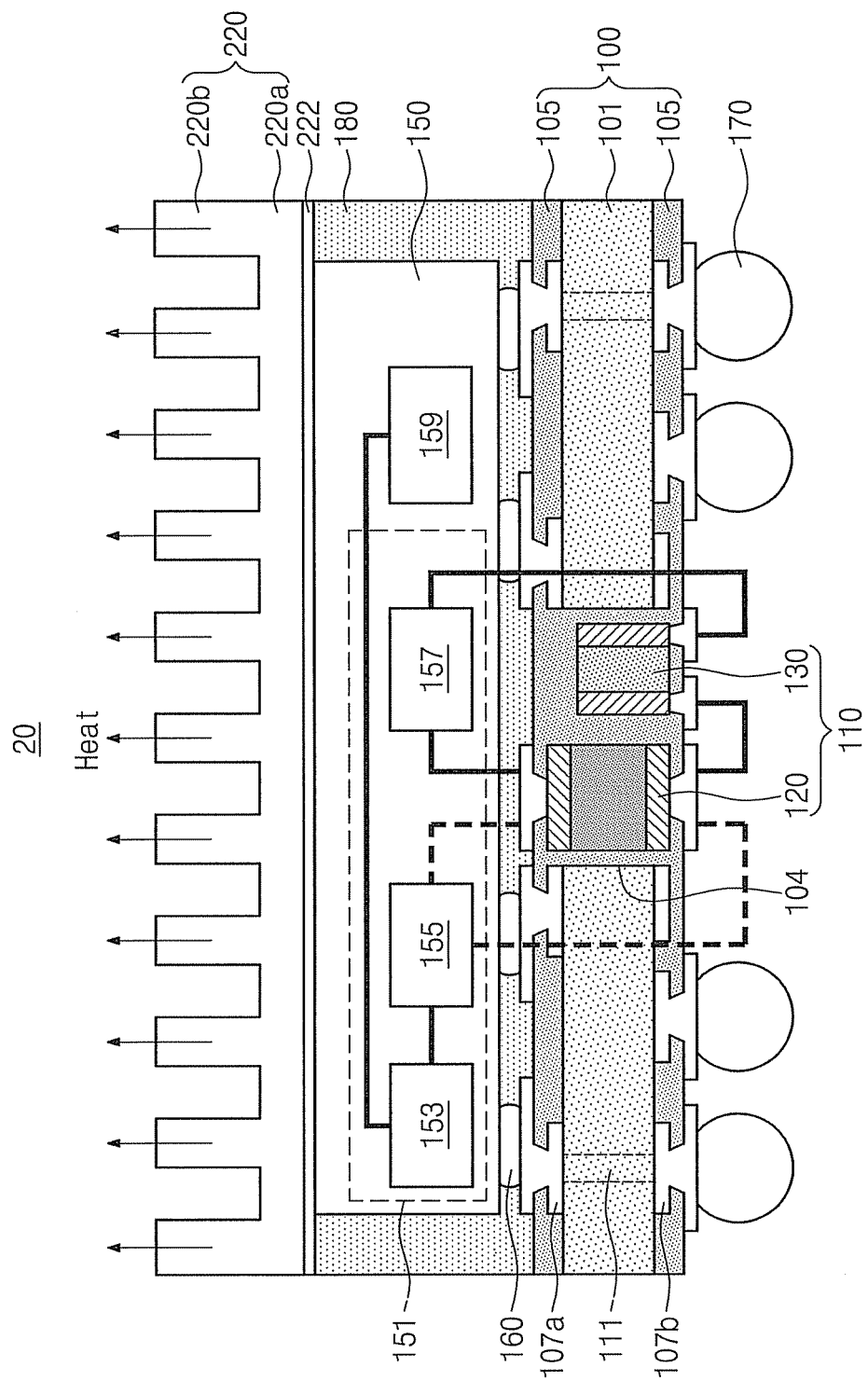

SEMICONDUCTOR DEVICES AND METHODS OF CONTROLLING TEMPERATURE THEREOF

CROSS-REFERENCE TO RELATED APPLICATIONS

This application claims priority under 35 U.S.C. §119 to the benefit of Korean Patent Application No. 10-2010-0118954, filed on Nov. 26, 2010, the entire contents of which are hereby incorporated by reference.

BACKGROUND

Some example embodiments relate to a semiconductor device and a method of controlling a temperature thereof.

In general, semiconductor devices generate more heat when semiconductor devices operate at higher speeds. If the amount of heat generated by a semiconductor device increases beyond a desired (or suitable) range, the performance of the semiconductor device may be affected. The performance of semiconductor devices used in small-sized mobile products may be affected if the heat generated by the devices increases beyond a desired (or suitable) range.

Also, data processing speeds may be more difficult to maintain at reliable levels if the temperature of the semiconductor device increases beyond a desired (or suitable) range. The operating speed of a semiconductor device may be reduced in order to decrease the amount of heat generated by the semiconductor device.

SUMMARY

Some example embodiments relate to semiconductor devices and/or methods to maintain and/or control a temperature of semiconductor devices at a desired (or suitable) level.

An example embodiment of the inventive concepts relates to a semiconductor device including a semiconductor package. The semiconductor package includes a semiconductor chip is mounted on a package substrate, a temperature measurement device configured to measure a temperature of the semiconductor package, and a temperature control circuit configured to receive from the temperature measurement device a signal corresponding to the temperature of the semiconductor package. The temperature control circuit is configured to change an operation speed of the semiconductor package on the basis of the signal.

The temperature measurement device may be embedded in the package substrate, and the temperature control circuit may be built in the semiconductor chip.

The temperature measurement device may include a thermistor in the package substrate, the thermistor including a resistance that varies with temperature. The thermistor may be configured to measure the temperature of the semiconductor package. A resistor may be electrically connected to the resistor.

The temperature control circuit may include a power unit electrically connected to the resistor, the power unit configured to supply a source voltage to the temperature measurement device. A conversion unit may be electrically connected to the thermistor. The conversion unit may be configured to convert an analog signal output received from the thermistor to a digital signal. A processing unit electrically connected to the conversion unit may be configured to receive the digital signal and change a power applied to the semiconductor chip on the basis of the digital signal.

The semiconductor package may further include a heat spreader configured to dissipate heat generated in the semiconductor chip away from the semiconductor chip.

The semiconductor chip may include a logic chip including the temperature control circuit and a memory chip mounted on the logic chip, and the temperature control circuit may be configured to change an operation speed of the logic chip and an operation speed of the memory chip.

An example embodiment of the inventive concepts relates to a semiconductor device including a semiconductor chip mounted on a package substrate, a thermistor configured to sense a temperature of the semiconductor chip and to output an output voltage corresponding to the temperature of the semiconductor chip, and a resistor connected to the thermistor. The semiconductor chip may include a power unit configured to apply a source voltage to the resistor and the thermistor. The semiconductor chip may include a conversion unit configured to convert the output voltage from the thermistor into a bit signal, and a processing unit configured to change an operation speed of the semiconductor chip on the basis of the bit signal.

The processing unit may be configured to increase the operation speed of the semiconductor chip if the processing unit determines the bit signal indicates the temperature of the semiconductor chip is lower than a reference temperature. The processing unit may be configured to decrease the operation speed of the semiconductor chip if the processing unit determines the bit signal indicates the temperature of the semiconductor chip is higher than the reference temperature.

At least one of the thermistor and resistor is one of: (i) embedded in the package substrate, (ii) surface-mounted on the package substrate, (iii) and surface-mounted on the semiconductor chip.

The thermistor may be mounted on a bottom surface of the package substrate. The semiconductor device may include a second thermistor mounted on a top surface of the package substrate. The resistor may be connected to the thermistor and the second thermistor.

The package substrate may define a cavity on one of a top surface of the package substrate and a bottom surface of the package substrate, and at least one of the thermistor and resistor may be in the cavity.

The package substrate may define an open hole that exposes a bottom of the semiconductor chip. The thermistor may be in the open hole. A solder bump connects the thermistor to the semiconductor chip.

The semiconductor device may further include a molding layer on the semiconductor chip and a heat spreader between the molding layer and the semiconductor chip. The heat spreader may be configured to dissipate heat generated in the semiconductor chip.

The heat spreader may surround the semiconductor chip and the heat spreader may be connected to the package substrate. The package substrate may further define a heat via that penetrates through the package substrate and connects to the heat spreader. The heat via may provide a dissipation path of the heat.

The semiconductor device may further include a heat spreader on the semiconductor chip.

The semiconductor device may further include a module substrate on which the package substrate is mounted, a module thermistor configured to measure a temperature of the module substrate, and a second resistor connected to the module thermistor.

An example embodiment of the inventive concepts relates to a semiconductor device including a semiconductor chip is mounted on a package substrate, a temperature measurement device embedded in the package substrate. The temperature measurement device may include a negative temperature coefficient thermistor, a resistor connected to the thermistor. The resistor may have a resistance that is constant regardless of temperature. The semiconductor chip may include a temperature control circuit configured to receive a resistance value from the negative temperature coefficient thermistor and to increase a power applied to the semiconductor chip on the basis of the resistance value and a reference resistance value.

The temperature control circuit may be configured to decrease the power if the resistance value of the negative temperature coefficient thermistor is lower than the reference resistance value.

The temperature control circuit may include a power unit configured to apply a source voltage to the temperature measurement device, an analog-digital converter electrically connected to the negative temperature coefficient thermistor. The analog-digital converter may be configured to receive the resistance value of the negative temperature coefficient thermistor and to convert the resistance value to a digital signal. The temperature control circuit may include a processing unit electrically connected to the analog-digital converter and configured to receive the digital signal and to adjust the power applied to the semiconductor chip on the basis of the digital signal.

An example embodiment of the inventive concepts relates to a semiconductor device including a semiconductor package. The semiconductor package includes a semiconductor chip mounted on a package substrate. A temperature measurement device may be embedded in the package substrate. The temperature measurement device may include a negative temperature coefficient thermistor configured to a sense a temperature of the semiconductor chip, and a resistor electrically connected to the thermistor. The resistor may have a resistance that is constant regardless of temperature. The semiconductor chip may include a temperature control circuit configured to decrease an operation speed of the semiconductor chip when the temperature sensed by the thermistor is higher than a reference temperature.

The temperature control circuit may be configured to increase the operation speed of the semiconductor chip if the temperature sensed by the thermistor temperature is lower than the reference temperature.

An example embodiment of the inventive concepts relates to a semiconductor device including a temperature measurement device embedded in a package substrate. The temperature measurement device may include a negative temperature coefficient thermistor connected to a resistor. The resistor may have a resistance that is constant regardless of temperature. The semiconductor device may further include a semiconductor chip mounted on the package substrate, the semiconductor chip including a built-in temperature control circuit. The temperature control circuit may include a power unit electrically connected to the temperature measurement device and configured to apply a source voltage to the temperature measurement device, an analog-digital converter electrically connected to the negative temperature coefficient thermistor and configured to receive a resistance value of the negative temperature coefficient thermistor. The analog-digital converter may be configured to convert the resistance value to a bit signal. A processing unit electrically connected to the analog-digital converter may be configured to receive the bit signal. The semiconductor device may further include a connection terminal between the package substrate and the semiconductor chip, in order to electrically connect the semiconductor chip to the package substrate, and a molding layer on the semiconductor chip.

The negative temperature coefficient thermistor may include a first resistance element between a first and a second electrode. The resistor may include a second resistance element between a third electrode and a fourth electrode. The second electrode may be electrically connected in series to the third electrode.

The fourth electrode may be electrically connected to the power unit. The resistor may be configured to receive the source voltage from the power unit. The first electrode may be grounded.

The first electrode may be electrically connected to the analog-digital converter, and the analog-digital converter may be configured to sense a resistance value of the negative temperature coefficient thermistor.

The package substrate may include a core including a top surface and a bottom surface. An upper metal layer may be on the top surface and the upper metal layer may be connected to the connection terminal. A lower metal layer on the bottom surface may be connected to an external terminal. A hole defined by the core may include a space in which the negative temperature coefficient thermistor and resistor are embedded.

The negative temperature coefficient thermistor may be configured to sense a temperature of the semiconductor chip. The negative temperature coefficient thermistor may be configured to output to the analog-digital converter a resistance value corresponding to the sensed temperature.

The processing unit may be configured to receive the resistance value, and be configured to increase a power applied to the semiconductor chip in order to increase an operation speed of the semiconductor chip if the resistance value is higher than a reference value. The processing unit may be configured to decrease the power applied to the semiconductor chip in order to decrease the operation speed of the semiconductor chip if the resistance value is lower than the reference value.

An example embodiment of the inventive concepts relates to a method of controlling a temperature of a semiconductor device including measuring a temperature of a semiconductor chip with a negative temperature coefficient thermistor, outputting a resistance value from the negative temperature coefficient thermistor, and changing a power applied to the semiconductor chip based on the resistance value and a reference resistance value. The resistance value may correspond to the temperature of the semiconductor chip.

The changing of power may include increasing the power applied to the semiconductor chip if the resistance value is higher than the reference resistance value, and decreasing the power applied to the semiconductor chip if the resistance value is lower than the reference resistance value.

The increasing the power may include increasing an operation speed of the semiconductor chip, and the decreasing the power may include decreasing the operation speed of the semiconductor chip.

The method of controlling a temperature of a semiconductor device may further include the resistor configured to decrease a self-heating of the negative temperature coefficient thermistor.

The method of controlling a temperature of a semiconductor device may further include delivering the resistance value to an analog-digital converter, converting the resistance value to a digital signal using the analog-digital converter, and delivering the digital signal to a processing unit. The changing a power applied to the semiconductor chip may be performed by the processing unit.

An example embodiment of the inventive concepts relates to a method of controlling a temperature of a semiconductor device including measuring a temperature of a semiconductor chip using a thermistor that is electrically connected to a resistor, and changing a power applied to the semiconductor chip on the basis of the measured temperature.

The changing of power may include decreasing the power applied to the semiconductor chip if the thermistor temperature is higher than the reference temperature; and increasing the power applied to the semiconductor chip if the thermistor temperature is lower than the reference temperature.

The method of controlling a temperature of a semiconductor device may further include decreasing the power applied to the semiconductor chip if the thermistor temperature is higher than the reference temperature and increasing the power applied to the semiconductor chip if the thermistor temperature is lower than the reference temperature.

The method of controlling a temperature of a semiconductor device may further include delivering a signal corresponding to the thermistor temperature to an analog-digital converter, converting the signal corresponding to the thermistor temperature to a digital signal using the analog-digital converter, and delivering the digital signal to a processing unit. The changing a power applied to the semiconductor chip may be performed by the processing unit.

An example embodiment of the inventive concepts relates to a semiconductor package including a processing unit configured to adjust a power supplied to a semiconductor chip based on an output from a thermistor connected to the semiconductor package. The power may be adjusted from a first power to a second power, both the first power and the second power being greater than 0 W.

The semiconductor package may further include a resistor connected to thermistor. The resistor may include a first electrode, a second electrode, and a resistive element between the first electrode and the second electrode.

The semiconductor package may further include a conversion unit connecting the thermistor to the processing unit. The conversion unit may be configured to convert the output into a digital signal. The processing unit may be configured to receive the digital signal. The processing unit may be configured to increase the power to the semiconductor chip if the processing unit determines the digital signal indicates the temperature of the semiconductor chip is lower than a desired temperature, and the processing unit may be configured to decrease the power supplied to the semiconductor chip if the processing unit determines the digital signal indicates the temperature of the semiconductor chip is higher than a desired temperature.

The semiconductor package may further include a resistor connected to thermistor. At least one of the resistor and the thermistor may be embedded in a substrate.

The semiconductor package may further include a resistor connected to thermistor. At least one of the resistor and the thermistor may be on the substrate.

The semiconductor package may further include a resistor connected to thermistor. At least one of the resistor and the thermistor may be on the semiconductor chip.

BRIEF DESCRIPTION OF THE DRAWINGS

The foregoing and other features and advantages of example embodiments of the inventive concepts will be apparent from the more particular description of non-limiting embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 3A to 3F are sectional views illustrating a method of fabricating a semiconductor package according to an example embodiment of the inventive concepts;

FIGS. 4A to 4K are sectional views illustrating semiconductor packages according to some example embodiments of the inventive concepts;

DETAILED DESCRIPTION OF EXAMPLE EMBODIMENTS

Figure 1A:
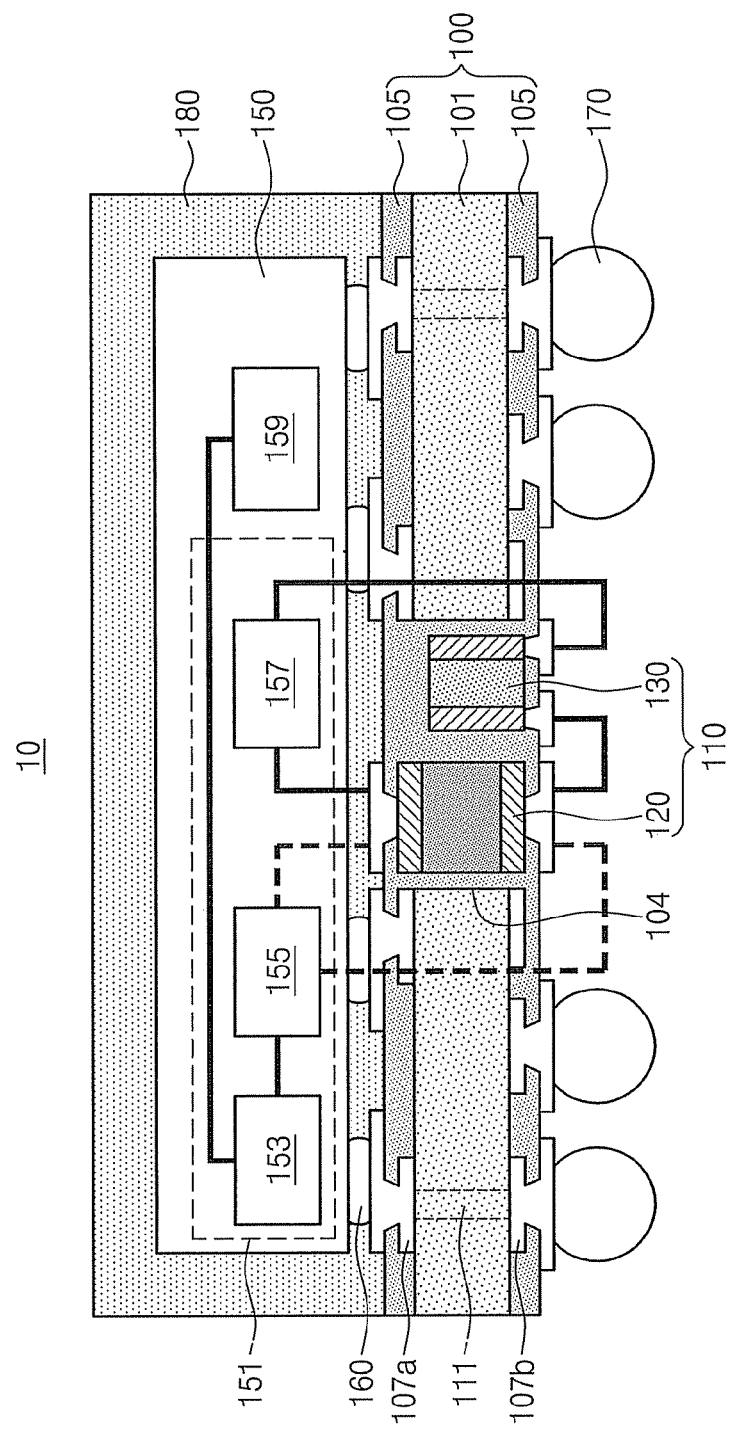
FIG. 1A is a sectional view illustrating a semiconductor package according to an example embodiment of the inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein Hereinafter, some example embodiments of the inventive concepts will be described in detail with reference to the accompanying drawings.

An Example Embodiment of a Semiconductor Package

Figure 1B:
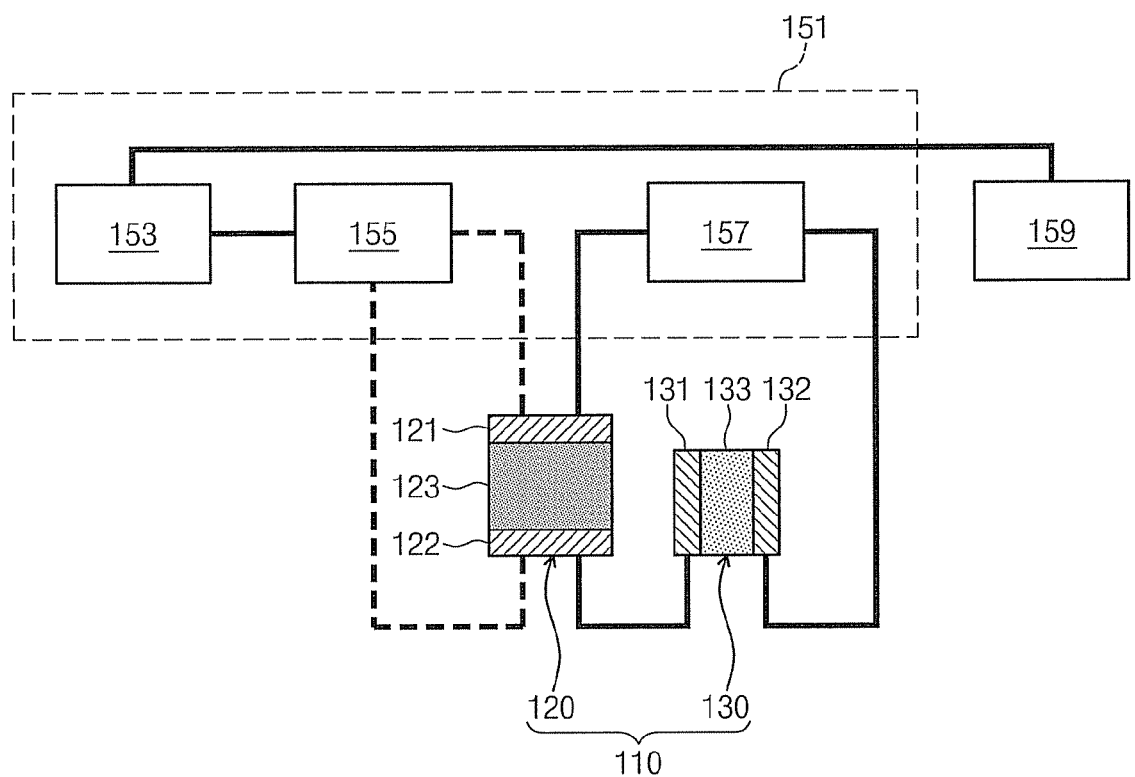
FIG. 1B is a schematic diagram showing a portion of FIG. 1A.
Figure 1C:
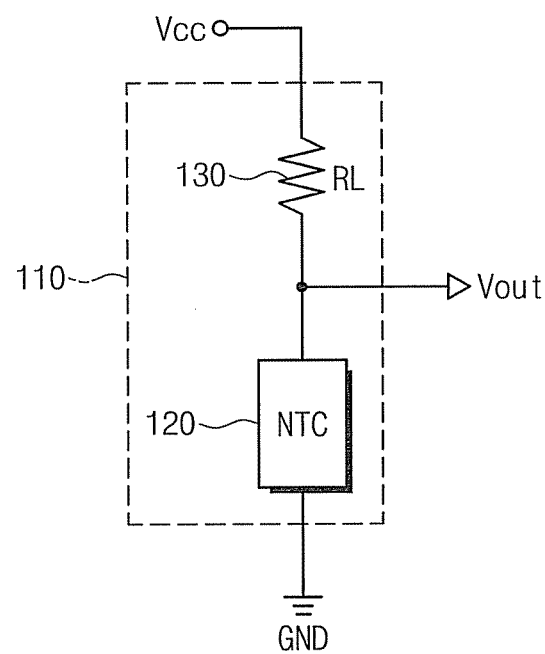
FIG. 1C is an equivalent circuit diagram showing another portion of FIG. 1A.

FIG. 1A is a sectional view illustrating a semiconductor package according to an example embodiment of the inventive concepts. FIG. 1B is a schematic diagram showing a portion of FIG. 1A. FIG. 1C is an equivalent circuit diagram showing another portion of FIG. 1A.

Referring to FIG. 1A, a semiconductor package 10 may include a package substrate 100 and a semiconductor chip 150 mounted on the package substrate 100. The semiconductor package 10 may further include a molding layer 180 on the semiconductor chip 150. The semiconductor package 10 may include a device 110 for measuring a temperature of the semiconductor package 10, and a temperature control circuit 151 for controlling the temperature of the semiconductor package 10 at a desired (or suitable) level on the basis of the temperature measured in the device 110. The temperature of the semiconductor package 10 may depend on heat generated from operating the semiconductor chip 150.

In a broad sense, the temperature of the semiconductor package 10 in this specification may refer to the temperature of the semiconductor chip 150, package substrate 100, and/or molding layer 180, i.e., the temperature of semiconductor package 10 itself. In a narrower sense, the temperature of the semiconductor package 10 may refer to the temperature of the semiconductor chip 150.

The temperature measurement device 110 can measure the temperature of the semiconductor package 10, and the temperature control circuit 151 can control an operation speed of the semiconductor chip 150, thereby maintaining (or substantially maintaining) the temperature of the semiconductor chip 150 at a desired (or suitable) level. By maintaining the temperature of the semiconductor chip 150 at a desired (or suitable) level, the semiconductor package 10, including the temperature measurement device 110 and temperature control circuit 151, may improve reliability by reducing malfunctions, reducing operation interruptions, reducing data loss, and maintaining data processing speed at a desired (and/or reliable) level. Hereinafter, the structure and temperature control of the semiconductor package 10 will be described in more detail.

The package substrate 100 may be a printed circuit board (PCB) including a double-sided coated insulation core 101, a plurality of upper metal layers 107a disposed at the top surface of the core 101, and a plurality of lower metal layers 107b disposed at the bottom surface of the core 101, but example embodiments are not limited thereto. At least one of the upper metal layers 107a may be electrically connected to at least one of the lower metal layers 107b. For example, the core 101 may include a through via 111 that electrically connects the upper metal layer 107a and the lower metal layer 107b. A solder ball 170 may be adhered to the at least one and/or lower metal layer 107b. The solder ball 170 may function as an external terminal. The solder ball 170 may electrically connect the semiconductor package 10 to another electric device, for example, a main board or a module board. The package substrate 100 may further include prepreg 105 (or alternatively resist) patterned in between the plurality of upper metal layers 107a on a top surface of the core 101. In addition, the package substrate 100 may further include prepreg 105 (or alternatively resist) patterned in between the plurality of lower metal layers 107b on the bottom surface of the core 101.

Heat generated in the semiconductor chip 150 may be dissipated through the molding layer 180 and/or through the package substrate 100. To measure the temperature of the semiconductor chip 150, the temperature measurement device 110 may be embedded in the package substrate 100, but example embodiments are not limited thereto. For example, the package substrate 100 may include at least one through hole 104 formed by eliminating a portion of the core 101, and the temperature measurement device 110 may be inserted into the through hole 104. By embedding the temperature measurement device 110 in the package substrate 100, the mounting area for the package substrate 100 can be increased, and the size of the semiconductor package 10 may be decreased.

The temperature measurement device 110 may include a thermistor 120 configured to sense heat generated in the semiconductor chip 150. For example, the thermistor 120 may be disposed under the center of the semiconductor chip 150 such that the temperature sensed by the thermistor 120 represents the temperature of the semiconductor package 10. The thermistor 120 includes a type of resistor having a resistance which varies with temperature. The thermistor 120 may be formed of a polymer, ceramic, and/or oxide of transition metal, but example embodiments are not limited thereto. In some example embodiments, the resistance of the thermistor 120 varies linearly (or about linearly) with temperature, and the relationship between the resistance and temperature may be expressed as Equation (1):

$$\Delta R = k \Delta T \quad (1)$$

In the above Equation (1), $\Delta R$ is a change in resistance, k is a first-order temperature coefficient of resistance, and $\Delta T$ is a change in temperature.

The thermistor 120 may be classified into two types according to the temperature coefficient of resistance k. For example, the thermistor 120 may be classified into a Positive Temperature Coefficient thermistor (PTC) when k>0 and a Negative Temperature Coefficient thermistor (NTC) when k<0. In PTC thermistors, the resistance increases when the temperature increases. In NTC thermistors, the resistance decreases when the temperature increases. According to an example embodiment of the inventive concepts, the thermistor 120 may be one of a Positive Temperature Coefficient thermistor (PTC) and a Negative Temperature Coefficient thermistor (NTC), for example, a Negative Temperature Coefficient thermistor (NTC).

When a current flows in the thermistor 120, the thermistor 120 generates heat, and thus the temperature of the thermistor 120 may become higher than that of its surroundings. If self-heating of the thermistor 120 is not corrected, an error may occur when the thermistor 120 measures a temperature, for example a temperature of the semiconductor package 10. According to an example embodiment of the inventive concepts, the temperature measurement device 110 may further include a resistor 130, configured to reduce the self-heating effect of the thermistor 120. The resistor 130, unlike the thermistor 120, may have the temperature coefficient of resistance k of about zero; thus, the resistance of the resistor 130 does not change (or does not change substantially) with changes in temperature. The resistor 130 may include a variable resistor. The electrical connection between the thermistor 120 and the resistor 130 and the influence the resistor 130 has on the amount of heat generated by the thermistor 120 will be described below.

As shown in FIG. 1A, the semiconductor chip 150 may be electrically connected to the package substrate 100 through a an electrical connection medium, for example, a bonding wire or a plurality of solder bumps 160 connected to the upper metal layer 107*a*, but example embodiments are not limited thereto. The semiconductor chip 150 may be a memory chip, a logic chip, and/or a combination thereof, but example embodiments are not limited thereto. According to some example embodiments, the semiconductor chip 150 may be a logic chip, for example a central processing unit (CPU) including the temperature control circuit 151. Alternatively, the semiconductor chip 150 may be a memory circuit that is integrated with a logic circuit, or a memory chip including the temperature control circuit 151. The semiconductor chip 150 may have a built-in temperature control circuit 151 that is electrically connected with the temperature measurement device 110.

The temperature control circuit 151 may include a power unit 157 configured to provide power required in an operation of the temperature measurement device 110, a conversion unit 155 configured to receive an analog signal (for example, voltage) corresponding to a temperature measured in the temperature measurement device 110 and configured to convert the analog signal to a digital signal and to output the digital signal, and a processing unit 153 configured to receive the digital signal from the conversion unit 155 to control a heating source 159 on the basis of the received digital signal.

For example, the conversion unit 155 may include an analog-digital converter (ADC). The heating source 159 may include the semiconductor chip 150 itself or a specific circuit inside the semiconductor chip 150. For convenience, FIG. 1A illustrates the heating source as a block marked with the reference numeral 159. The processing unit 153 may control the operation speed of the semiconductor chip 150 for its operation speed to become lower when the temperature of the semiconductor package 10 is higher than a reference temperature. In contrast, the processing unit 153 may control the semiconductor chip 150 and adjust a operation speed of the semiconductor chip 159 to become higher (for example, to operate at a higher or highest speed of the semiconductor chip 159) when a temperature of the semiconductor package 10 is lower than the reference temperature.

"Reference temperature" in this specification may denote the highest temperature at which there is no (or substantially no) abnormal operation (for example, malfunction) in the semiconductor package 10, i.e., the maximum allowable temperature or greater at which the semiconductor package 10 may operate stably (or substantially stably).

The temperature measurement device 110 may be embedded in the package substrate 100, and the temperature control circuit 151 may be built in the semiconductor chip 150, but example embodiments are not limited thereto. A temperature of the semiconductor package 10 may be controlled through the operation of the semiconductor package 10.

Referring to FIGS. 1A and 1B, the thermistor 120 may include a resistance element 123 formed of ceramic or polymer that is inserted between two metal electrodes 121 and 122. The thermistor 120 may be a Negative Temperature Coefficient (NTC) having the resistance element 123 including transition metal oxide, for example, nickel oxide, cobalt oxide, manganese oxide, iron oxide, and combinations thereof. As another example, the thermistor 120 may be a Positive Temperature Coefficient (PTC) having the resistance element 123 including barium titanate or being formed of a carbon powder and an organic binder.

The structure of the resistor 130 may include a resistance element 133 formed of metal and/or insulator that is inserted between two metal electrodes 131 and 132. For example, the resistance element 133 may include carbon, ceramic conductor (for example, TaN, PbO, $RuO_2$, and NiCr), metal, and metal oxide, but example embodiments are not limited thereto. In some example embodiments, the structure of at least one of the thermistor 120 and at least one resistor 130 may be a multi-layer structure including a plurality of resistance elements inserted between a plurality of electrodes.

In the package substrate 100, the thermistor 120 may be embedded in a vertical state, and the resistor 130 may be embedded in a horizontal state. For example, the thermistor 120 may be embedded in a vertical state in which main stream of current is vertical in the thermistor 120 because the electrodes 121 and 122 are located at the top and bottom, and in contrast, the resistor 130 may be embedded in a horizontal state in which main stream of current is horizontal in the resistor 130 because the electrodes 131 and 132 are located at the right and left sides. However, example embodiments are not limited thereto and either the thermistor 120 and/or the resistor 130 may be embedded in state rotated between a vertical and a horizontal state Referring to FIGS. 1B and 1C, the thermistor 120 and the resistor 130 may be connected in series, and both ends of the temperature measurement device 110 may be connected to the power unit 157. For example, a second electrode 122 of the thermistor 120 may be connected to a first electrode 131 of the resistor 130, and the thermistor 120 and resistor 130 may be connected in series. A second electrode 132 of the resistor 130 may be connected with one end of a power unit 157, and a first electrode 121 of the thermistor 120 may be connected with another end of the power unit 157. The temperature measurement device 110 may receive a source voltage Vcc from the power unit 157. The power unit 157 may provide operating power that allows the thermistor 120 to measure a temperature of the semiconductor package 10.

The thermistor 120 includes a resistance that varies with temperature. Due to this characteristic, a limited current may flow at an initial stage when a current flows in the thermistor 120 by applying the source voltage Vcc, but the current may induce the thermistor 120 to be self-heated, thereby decreasing the resistance of the thermistor 120.

If there is no resistor 130, the amount $P_{without\_resistor}$ of heat generation of the thermistor 120 may be expressed as Equation (2):

$$P_{without\_resistor} = \frac{(Vcc)^2}{R_{Thermistor}} \quad (2)$$

In the above Equation (2), $R_{Thermistor}$ is the resistance of the thermistor 120, and Vcc is the source voltage.

Unlike Equation (2), if there is a resistor 130 according to some example embodiments, the amount $P_{with\_resistor}$ of heat generation of the thermistor 120 may be expressed as Equation (3):

$$P_{with\_resistor} = \frac{\left(\frac{R_{Thermistor}}{R_{Thermistor} + R_{RL}} \times Vcc\right)^2}{R_{Thermistor}} \quad (3)$$

In the above Equation (3), $R_{RL}$ is the resistance of the resistor 130.

If Equation (3) is divided by Equation (2), a value less than 1 (and/or significantly less than 1) may be obtained as Equation (4):

$$\frac{P_{with\_resistor}}{P_{without\_resistor}} = \left(\frac{R_{Thermistor}}{R_{Thermistor} + R_{RL}}\right)^2 \ll 1 \quad (4)$$

In other words, the amount $P_{with\_resistor}$ of heat generation when there is the resistor 130 may be less (and/or significantly) less than the amount $P_{without\_resistor}$ of heat generation when there is no resistor 130. As the resistance $R_{RL}$ of the resistor 130 increases, the amount of heat generation may decrease more. According to some example embodiments, the temperature measurement device 110 may include one (or more than one) of the resistor 130 to offset an error of temperature measurement due to self-heating of the thermistor 120.

The temperature measured by the thermistor 120 may be given as an output voltage Vout, Vout being an analog signal. The conversion unit 155 may convert the output voltage Vout from an analog signal into a digital signal. The processing unit 153 may receive the digital signal output from the conversion unit 155. The output voltage Vout may be expressed as Equation (5):

$$V_{out} = \frac{R_{Thermistor}}{R_{Thermistor} + R_{RL}} \times Vcc \quad (5)$$

Figure 2A:
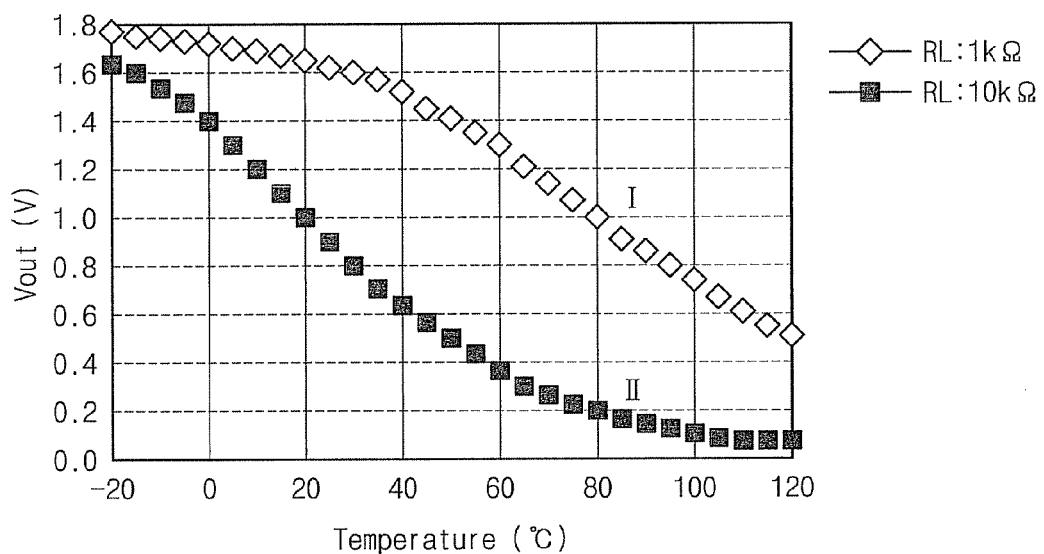
FIG. 2A is a graph showing an output voltage versus temperature of semiconductor packages according to some example embodiments of the inventive concepts.
Figure 2B:
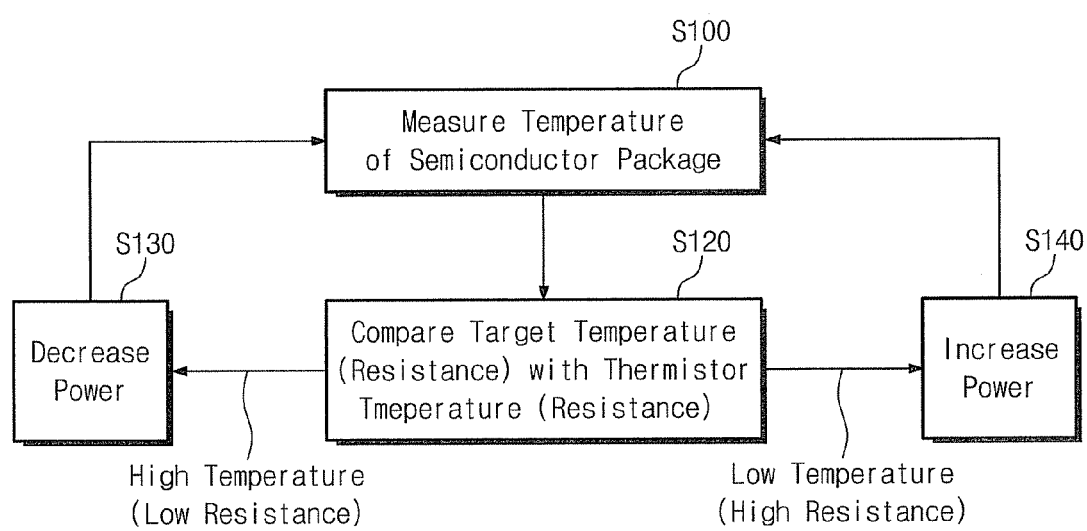
FIG. 2B is a flowchart illustrating a temperature control method in semiconductor packages according to an example embodiment of the inventive concepts.
Figure 2C:
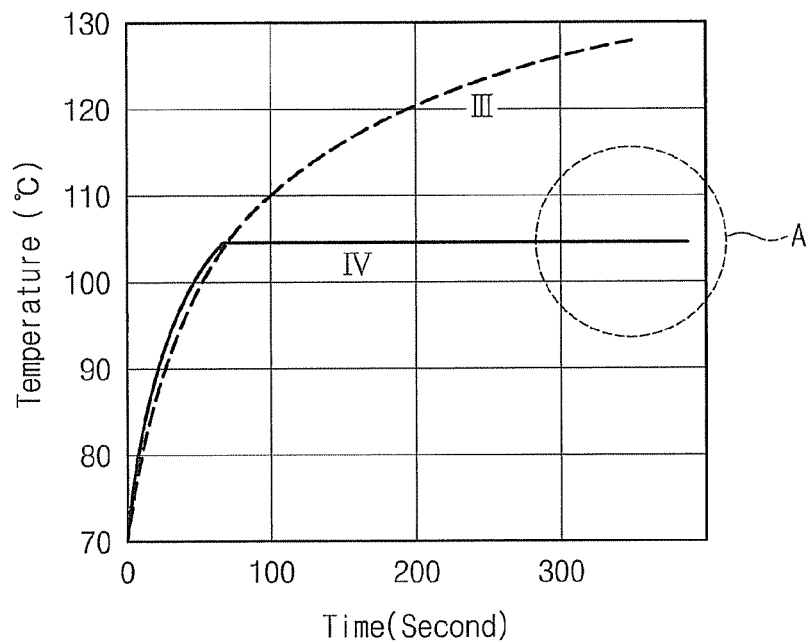
FIG. 2C is a graph showing a temperature of a semiconductor package controlled by a temperature control method according to an example embodiment of the inventive concepts.
Figure 2D:
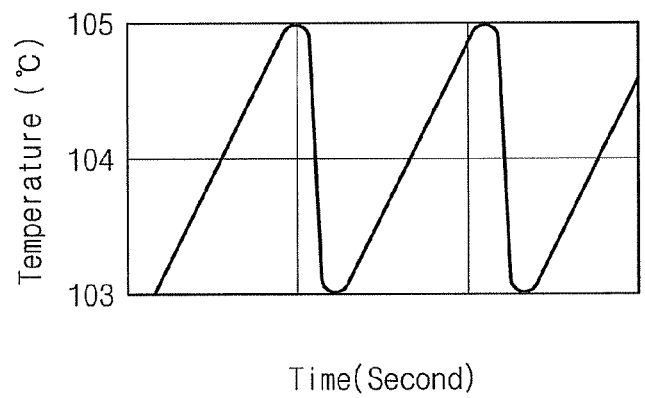
FIG. 2D is a graph showing a portion of FIG. 2C.

FIG. 2A is a graph showing an output voltage of semiconductor packages according to some example embodiments of the inventive concepts. FIG. 2B is a flowchart illustrating a temperature control method in semiconductor packages according to some example embodiments of the inventive concepts. FIG. 2C is a graph showing a temperature of a semiconductor package controlled by a temperature control method according to some example embodiments of the inventive concepts. FIG. 2D is a graph showing a portion of FIG. 2C.

Referring to FIG. 2A, as the temperature of the semiconductor package increases, the output voltage Vout may decrease. The line I may indicate the output voltage Vout of a thermistor 120 when the source voltage Vcc is 1.8V, and the resistance $R_{RL}$ of the resistor 130 is 1 kΩ, according to an example embodiment. The line II may indicate the output voltage Vout of thermistor 120 when the source voltage Vcc is 1.8V, and the resistance $R_{RL}$ of the resistor 130 is 10 kΩ, according to an example embodiment. If the output voltage Vout is given, the temperature of the semiconductor package 10 may be estimated. When the conversion unit 155 is a 12-bit ADC, the conversion unit 155 may output the output voltage Vout ranging about 0V to about 1.8V in $2^{12}$ (=4096) stages, and the processing unit 153 may read these bit stages to recognize the temperature of the semiconductor package 10. According to some example embodiments, the range of temperature measurement may be extended to a high temperature (for example, 80° C., but example embodiments are not limited thereto), and the accuracy and/or precision of temperature measurement may be about ±1° C.

Referring to FIGS. 1A and 2B, according to an example embodiment of the inventive concepts, the temperature of the semiconductor package 10 may be measured using the temperature measurement device 110 in operation S100. The temperature (resistance) of the semiconductor package 10 may be compared with a reference temperature (resistance) using the temperature control circuit 151 in operation S120. The processing unit 153 may be in charge of the temperature (resistance) comparison.

Heat generated through the operation of the semiconductor chip 150 may be sensed by the thermistor 120, and thus the resistance value of the thermistor 120 may change, depending on a temperature sensed. In a case in which the thermistor 120 is a Negative Temperature Coefficient (NTC), when the temperature of the semiconductor package 10 may rise over a reference point, the resistance of the thermistor 120 may drop below a reference (target) resistance, for example the resistance of the thermistor 120 corresponding to the reference (target) temperature. If the resistance of the thermistor 120 is lower than the reference point, then the temperature of the semiconductor package 10 may be higher than the reference point. In contrast, if the resistance of the thermistor 120 is higher than the reference point, then the temperature of the semiconductor package 10 may be lower than the reference point.

The temperature of the thermistor 120 may represent that of the semiconductor package 10. When the thermistor 120 is in a high temperature (low resistance) state where a temperature (resistance) is higher (lower) than the reference temperature (resistance), this may mean that the semiconductor package 10 has been overheated. The processing unit 153, receiving a temperature (resistance) indicating the semiconductor package 10 has been overheated, may decrease power applied to the heating source 159 in order to decrease an operation speed of the semiconductor chip 150 in operation S130. The processing unit 153 may decrease power applied to the heating source 159 to a power greater than or equal to 0 W. In contrast, when the thermistor 120 is in a low temperature (high resistance) state where a temperature (resistance) is lower (higher) than the reference temperature (resistance), this may mean that the semiconductor package 10 has a temperature below the reference point. Thus, the processing unit 153, receiving a temperature (resistance) indicating the semiconductor package has been underheated, may increase power applied to the heating source 159, thereby increasing the operation speed of the semiconductor chip 150 in operation S130.

Referring to FIG. 2C, if the temperature of the semiconductor package 10 is not controlled suitably (and/or desirably), the temperature may rise over the reference temperature of about 105° C. to about 110° C. (which is merely an example reference temperature, example embodiments of the inventive concepts are not limited thereto), and thus abnormal operation such as malfunction may happen (see III). However, the temperature of the semiconductor package (10), according to some example embodiments, may be suitably (and/or desirably) controlled and/or may be maintained below the reference temperature (see IV). For example, if power applied to the semiconductor chip 150 is decreased or increased according to the temperature (resistance) of the thermistor 120, as in FIG. 2D showing a enlarged "A" part of FIG. 2C, the temperature of the semiconductor package 10 may fluctuate below the reference temperature but may not rise over the reference temperature to secure stable (and/or desirable) operation of the semiconductor package 10.

Example Embodiment of the Method

FIGS. 3A to 3F are sectional views illustrating a method of fabricating a semiconductor package according to an example embodiment of the inventive concepts.

Referring to FIG. 3A, a core 101 including a top surface 101a and opposite bottom surface 101b may be provided, and a through hole 104 may be formed by removing a portion of the core 101. The core 101 may be formed of reinforced fiberglass or epoxy resin, but example embodiments are not limited thereto. A plurality of upper metal patterns 102a may be formed at the top surface 101a of the core 101, and a plurality of lower metal patterns 102b may be formed at the bottom surface 101b, before or after formation of the through hole 104. The metal patterns 102a and 102b may be formed of metal, for example, copper (Cu), but example embodiments are not limited thereto. The core 101 may include at least one through via 111 passing through the core 101. The through via 111 may connect at least one of the upper metal patterns 102a to at least one of the lower metal patterns 102b.

Referring to FIG. 3B, the core 101 may be disposed on a support plate 109, and the thermistor 120 and the resistor 130 may be inserted into the through hole 104. The thermistor 120 and resistor 130 may have a thickness that is equal to or less than the sum of the thicknesses of the core 101, the upper metal pattern 102a, and the lower metal pattern 102b. The support plate 109, as an example, may be an insulation substrate and/or tape and the support plate 109 may be adhered to the bottom surface 101b of the core 101 using an adhesive. The top surface 101a of the core 101 may be coated with prepreg 105a (or alternatively resist). The prepreg 105a may penetrate through the hole 104 to surround the thermistor 120 and resistor 130.

The thermistor 120 may include the resistance element 123 disposed between first and second electrodes 121 and 122. Similarly, the resistor 130 may include the resistance element 133 disposed between first and second electrodes 131 and 132. At least one of the thermistor 120 and the resistor 130 may be inserted into the through the hole 104 in a vertical state, a horizontal state, or a state rotated between a vertical and a horizontal state. For example, the thermistor 120 may be inserted in a vertical state, and the resistor 130 may be inserted in a horizontal state.

Figure 3C:
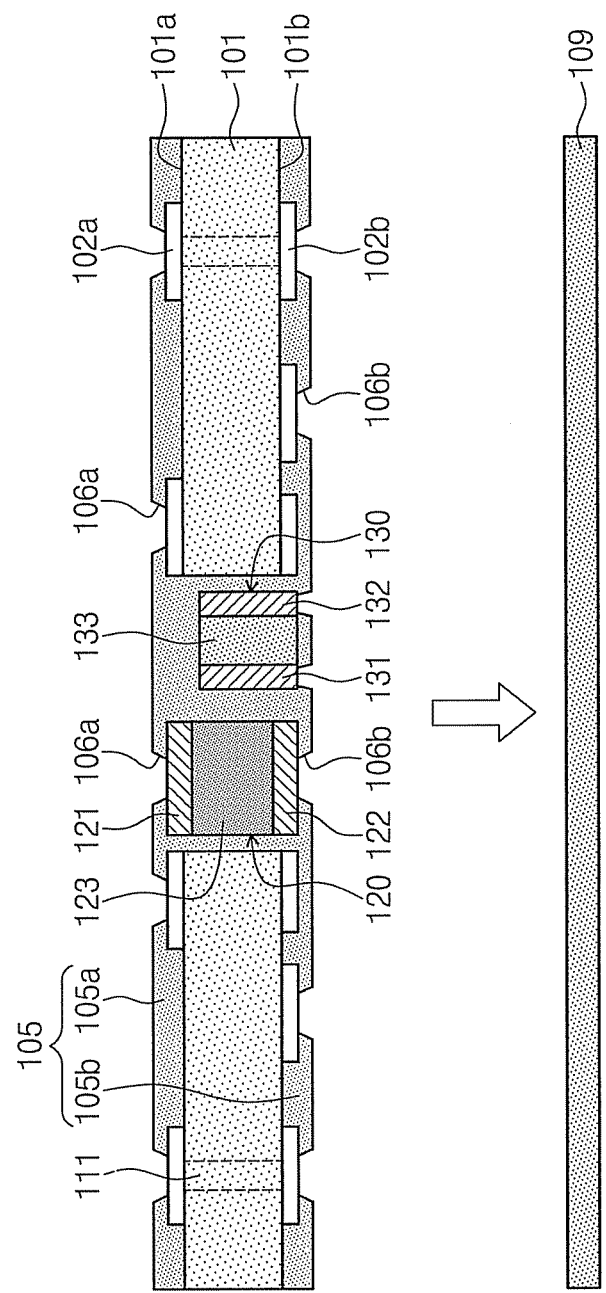

Referring to FIG. 3C, the support plate 109 may be removed, and the bottom surface 101b of the core 101 may be coated with prepreg 105b. The core 101 may be double-side coated with the prepreg 105. Upper openings 106a opening between the upper metal patterns 102a and lower openings 106b opening between the lower metal patterns 102b may be formed by removing a portion of the prepreg 105. The first electrode 121 and second electrode 122 of the thermistor 120 may be exposed at least partially by the upper opening 106a and the lower opening 106b, respectively. The first electrode 131 and the second electrode 132 of the resistor 130 may be exposed at least partially by the lower openings 106b.

Figure 3D:
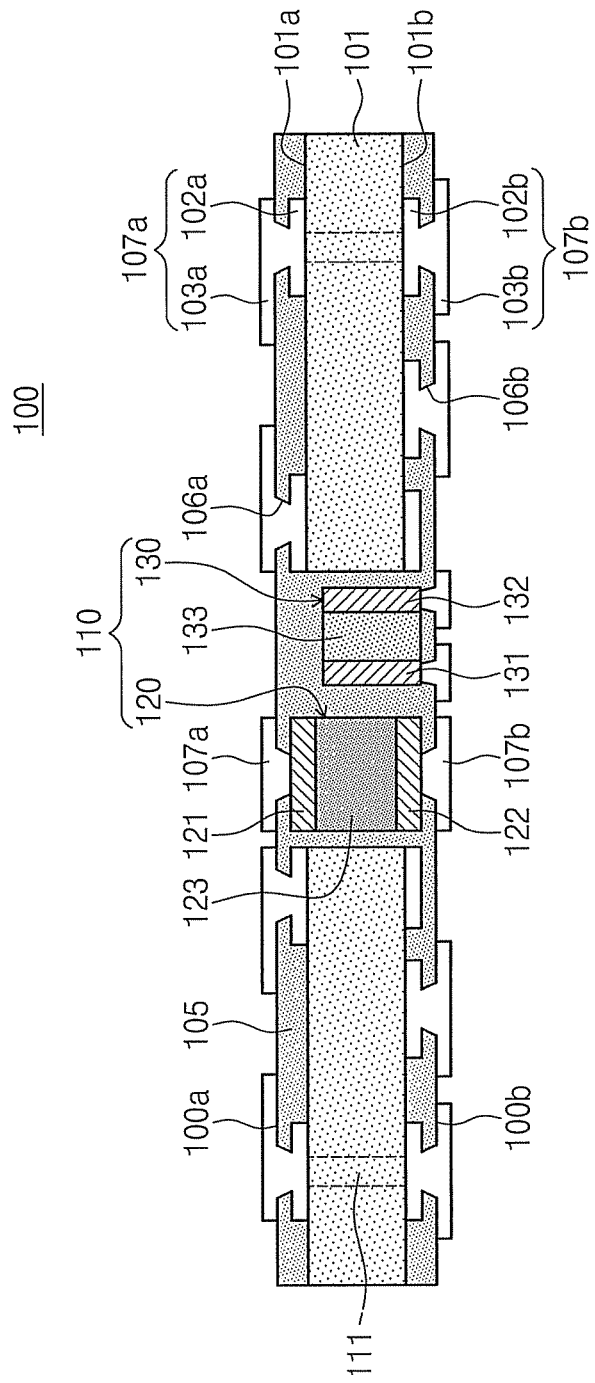

Referring to FIG. 3D, the package substrate 100 may be formed by forming upper metal layers 107a and lower metal layers 107b. For example, metal layers 103a connected with the upper metal patterns 102a through the upper openings 106a may be formed, and metal layers 103b connected with the lower metal patterns 102b through the lower openings 106b may be formed, by processes including deposition, printing of metal, and/or electroplating, but example embodiments are not limited thereto. Thus, the package substrate 100, in which the temperature measurement device 110 having a top surface 100a in which upper metal layers 107a are formed and a bottom surface 100b in which lower metal layers 107b are formed and including the thermistor 120 and resistor 130 is embedded, may be formed. At least one of the upper metal layers 107a may be connected to at least one of the lower metal layers 107b by the through via 111.

Referring to FIG. 3E, the semiconductor chip 150 may be mounted on the top surface 100a of the package substrate 100. As an example, the semiconductor chip 150 may be mounted on the top surface 100a of the package substrate 100 by disposing solder bumps 160 aligned with the upper metal layers 107a between the semiconductor chip 150 and package substrate 100. The temperature control circuit 151 may be electrically connected with the temperature measurement device 110 through a medium of the solder bumps 160 and metal layers 107a and 107b by mounting the semiconductor chip 150 on the package substrate 100. The temperature control circuit 151, as previously mentioned in FIG. 1A, may include a power unit 157 supplying power to the temperature measurement device 110, a conversion unit 155 converting an analog signal corresponding to a temperature measured by the temperature measurement device 110 to a digital signal, and a processing unit 153 receiving the digital signal to increase and/or decrease power supplied to the heating source 159.

Referring to FIG. 3F, a molding layer 180 may be formed on the semiconductor chip 150 to protect the semiconductor chip 150 from the external environment. The molding layer 180 may be formed by a hardening Epoxy Molding Compound (EMC), but example embodiments are not limited thereto. According to some example embodiments, a semiconductor chip 150 with the built-in temperature control circuit 151 may be mounted on the package substrate 100 in which the temperature measurement device 110 is embedded, and the semiconductor package 10 molded by the molding layer 180 may be formed. A solder ball 170 may be further formed as an external terminal for connecting the semiconductor package 10 to an external electric device. For example, at least one solder ball 170 may be adhered to at least one of the lower metal layers 107*b* formed on the bottom surface 100*b* of the package substrate 100.

Some Example Embodiments of a Semiconductor Package

FIGS. 4A to 4K are sectional views illustrating semiconductor packages according to some embodiments of the inventive concepts. FIG. 4L is an equivalent circuit diagram illustrating a portion of FIG. 4K. Since some elements of the semiconductor packages are the same as (or similar) to some elements of the semiconductor package of FIG. 1A, repetitive descriptions of the same elements will be omitted, and the different elements will be described in detail.

Figure 4A:
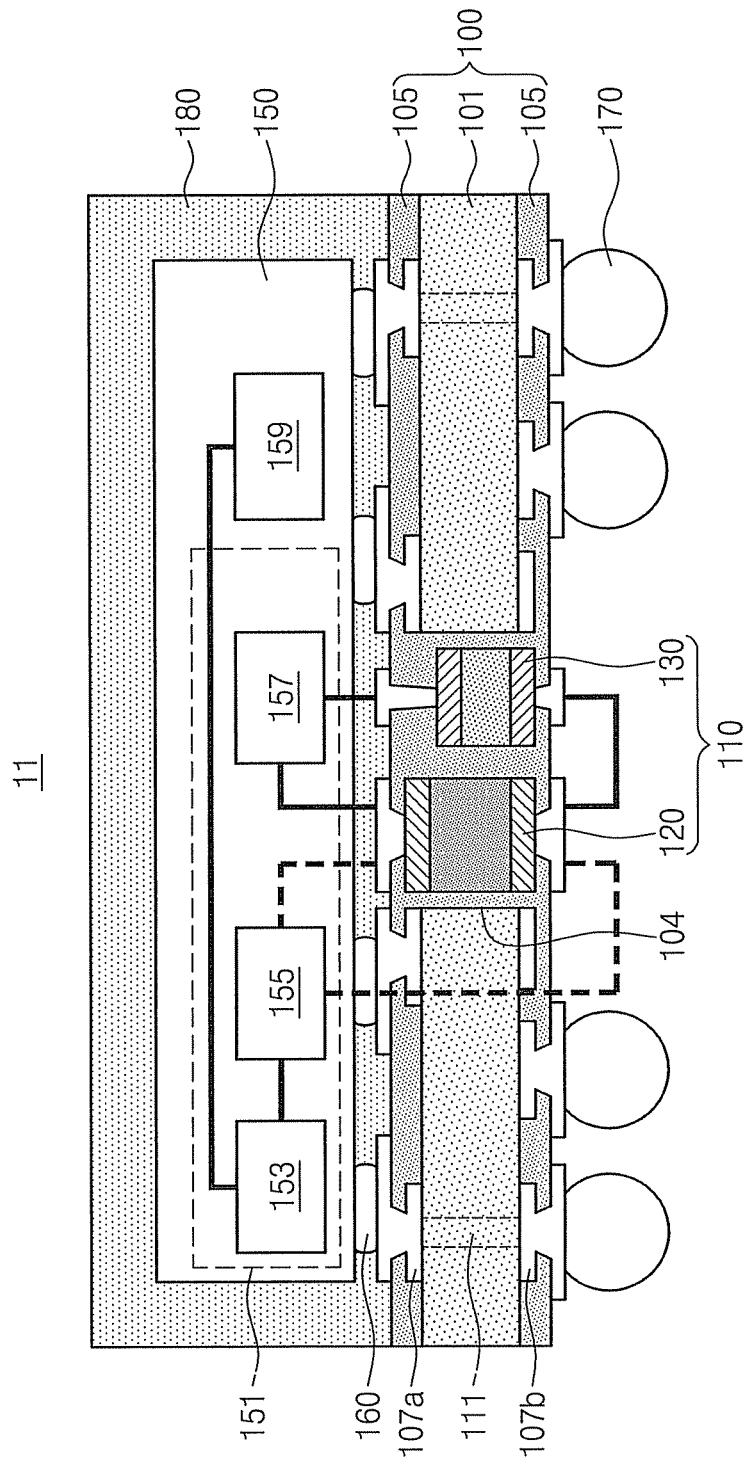

Referring to FIG. 4A, a semiconductor package 11 may include the resistor 130 embedded in the package substrate 100 in a vertical state unlike in the FIG. 1A. The resistor 130 may be electrically connected with a power unit 157 through a medium of the upper metal layer 107*a*.

Figure 4B:
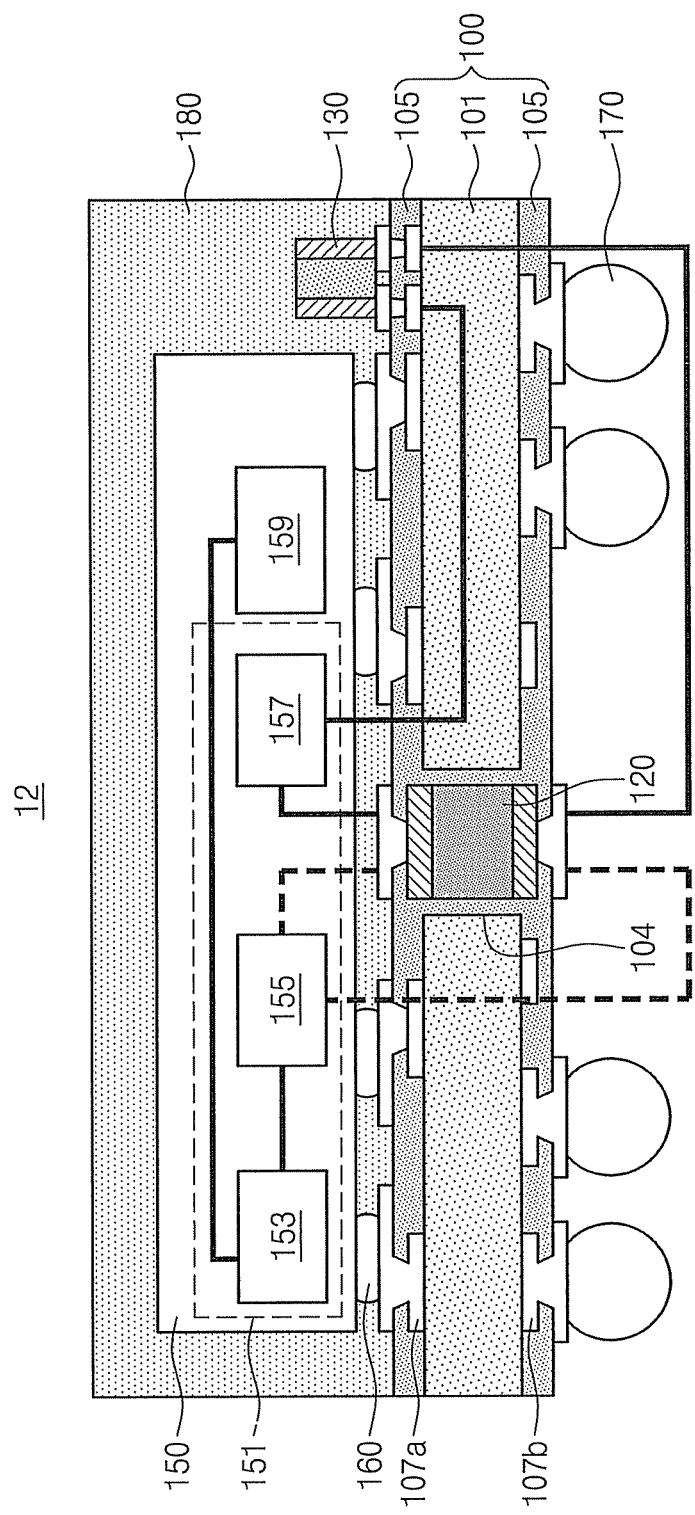

Referring to FIG. 4B, a semiconductor package 12 may include the thermistor 120 embedded in the package substrate 100 and the resistor 130 mounted on a surface of the package substrate 100. The thermistor 120 may be embedded below the center of the semiconductor chip 150 to measure the temperature of the semiconductor chip 150. Thus, the temperature (resistance) of thermistor 120 may represent that of the semiconductor chip 150. Since the resistor 130 has no direct relationship with measuring the temperature of the semiconductor chip 150, the resistor 130 may be surface-mounted at the outer of the semiconductor chip 150 on the package substrate 100. The resistor 130 may be surface mounted on a top surface and/or a bottom surface of the package substrate 100.

Figure 4C:
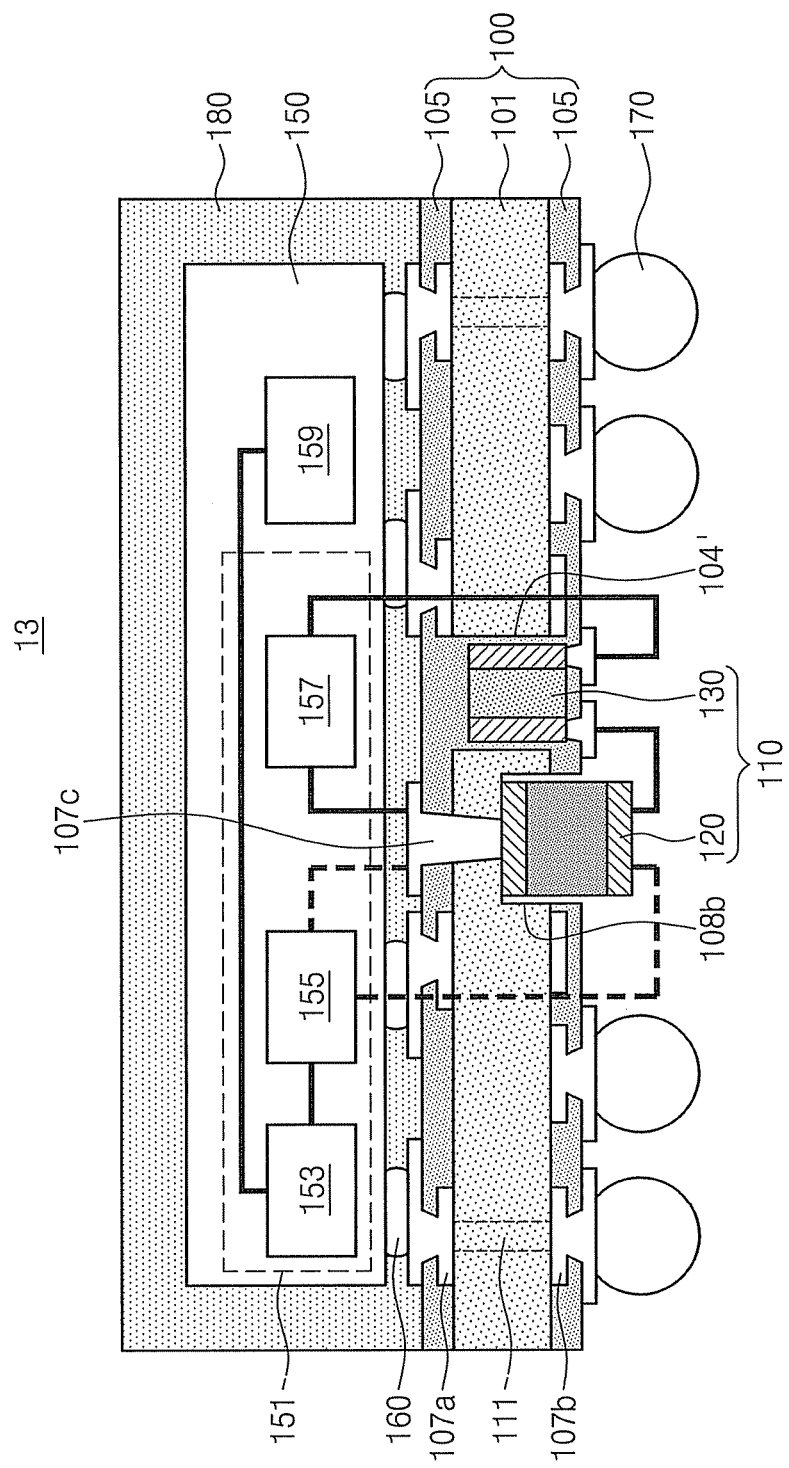

Referring to FIG. 4C, a semiconductor package 13 may be include the thermistor 120 surface-mounted on a recessed bottom surface of the package substrate 100. The package substrate 100 may include a lower cavity 108*b* into which the thermistor 120 may be inserted, on the bottom surface of the package substrate 100. The package substrate 100 may further include an upper contact 107*c* for electrically connecting the thermistor 120 to the conversion unit 155 and the power unit 157. According to an example embodiment, as illustrated in FIG. 4C, the thermistor 120 may be easily replaced. The resistor 130 may be embedded in a through hole 104' passing through the package substrate 110. Alternatively, the resistor 130 may be surface-mounted in the lower cavity 108*b* or on the package substrate 100.

Figure 4D:
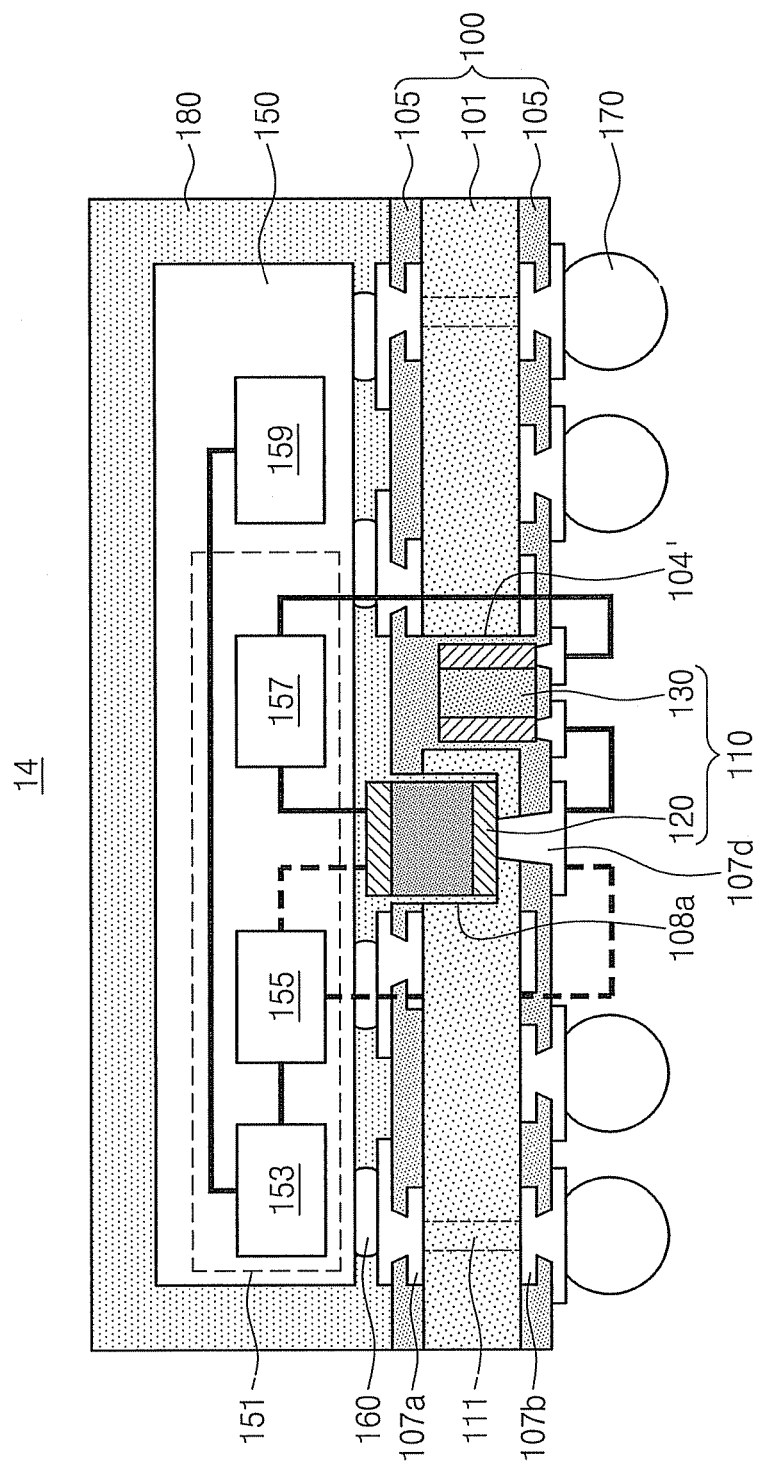

Referring to FIG. 4D, a semiconductor package 14 may include the thermistor 120 surface-mounted on a recessed top surface of the package substrate 100. The package substrate 100 may include an upper cavity 108*a* into which the thermistor 120 may be inserted, on the top surface of the package substrate 100. The package substrate 100 may further include a lower contact 107*d* for electrically connecting the thermistor 120 to the resistor 130 and the conversion unit 155. According to an example embodiment, as illustrated in FIG. 4D, since the thermistor 120 is near the semiconductor chip 150, the temperature of the semiconductor chip 150 may be measured more precisely. The resistor 130 may be embedded in the through hole 104' or surface-mounted in the upper cavity 108*a* or on the package substrate 100.

Figure 4E:
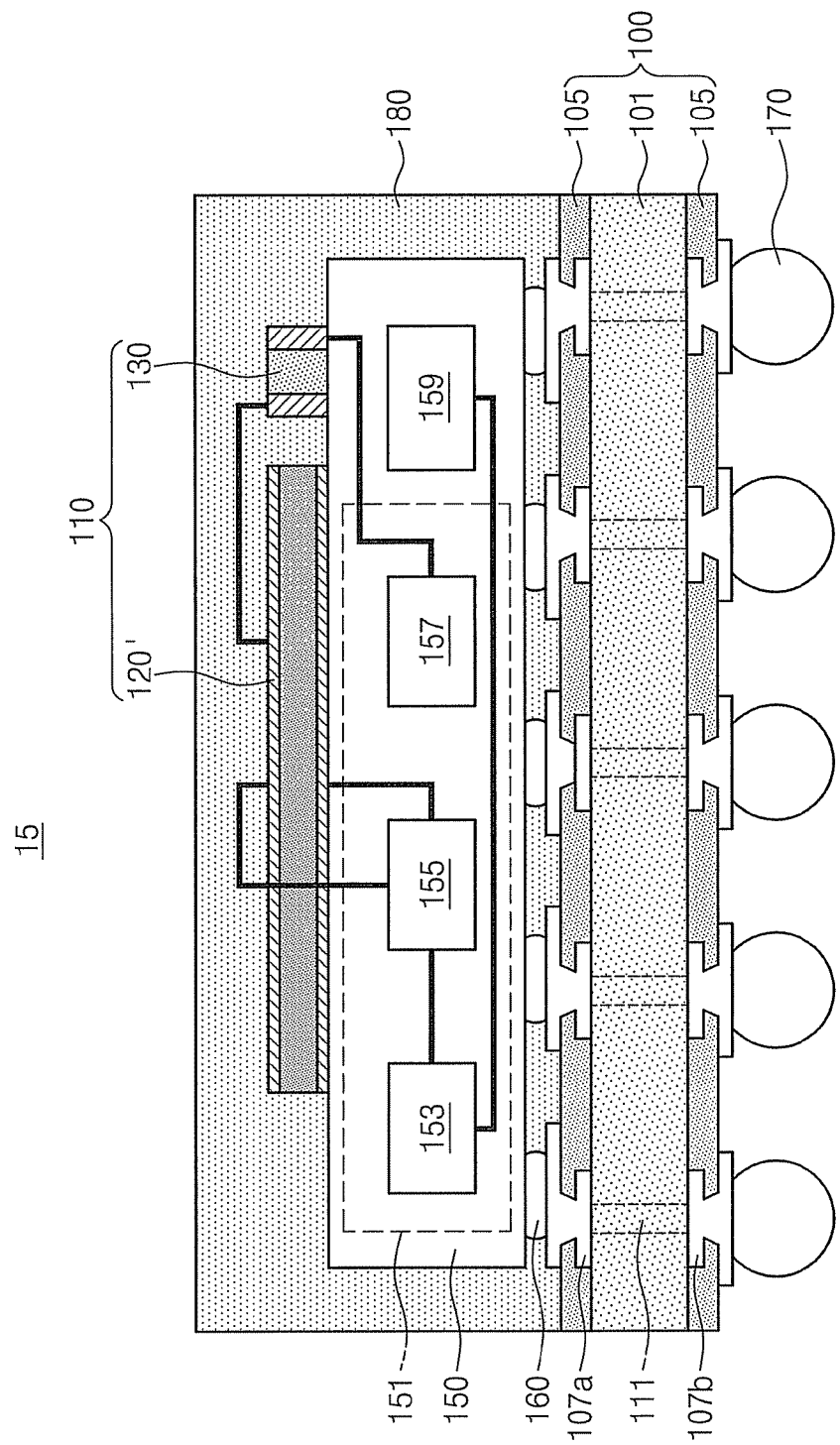

Referring to FIG. 4E, a semiconductor package 15 may include the thermistor 120' surface-mounted on the semiconductor 150. The thermistor 120' may be of a thin film structure that is comparatively larger than those of some other example embodiments. The resistor 130 may be embedded in the package substrate 100 or surface-mounted on the semiconductor chip 150 or package substrate 100. According to an example embodiment, as shown in FIG. 4E, the resistor 130 may be surface-mounted on the semiconductor chip 150 to be disposed near the thermistor 120'.

Figure 4F:
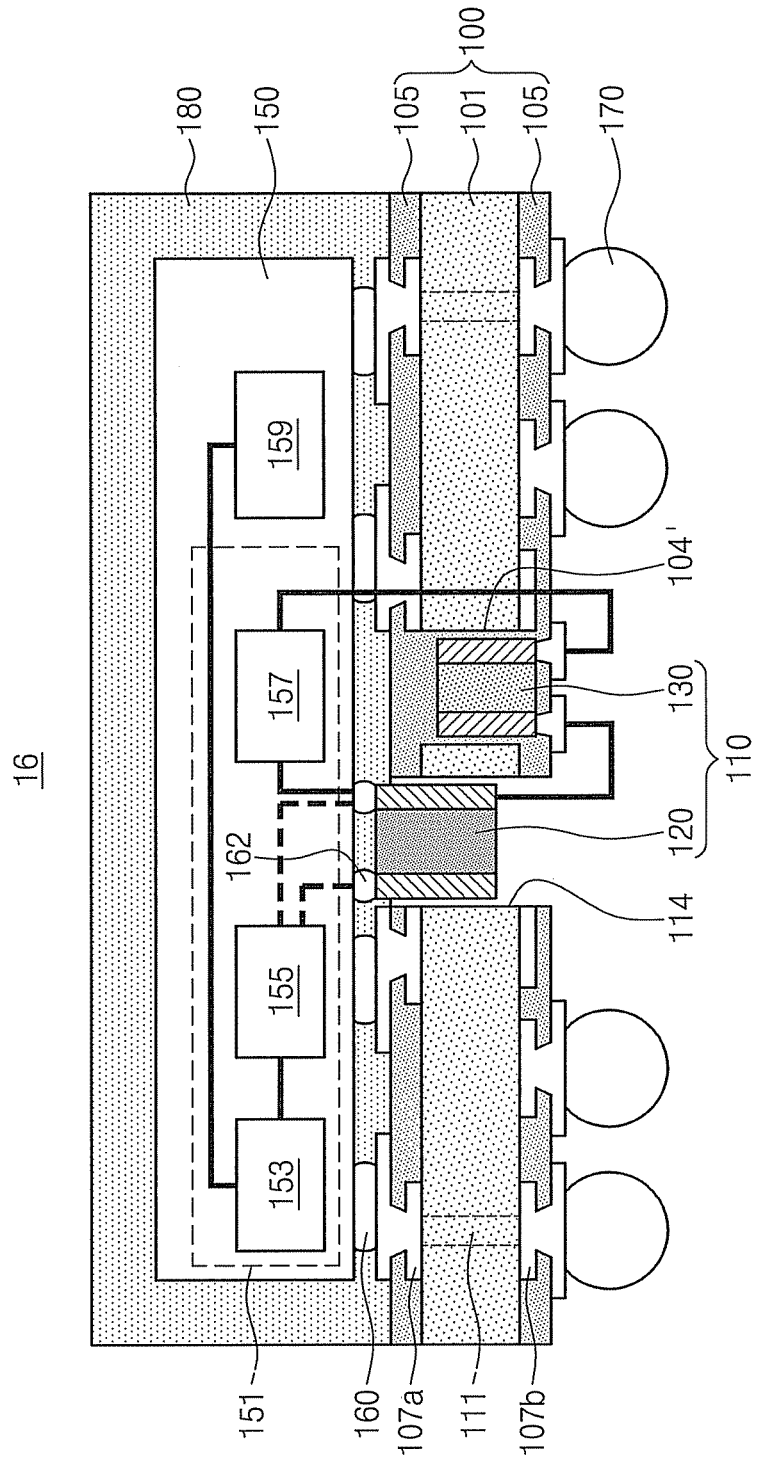

Referring to FIG. 4F, a semiconductor package 16 may include the thermistor 120 connected to the semiconductor chip 150. As an example, the thermistor 120 may be connected (and/or directly connected) to a solder bump 162 that is connected (and/or directly connected) to the semiconductor chip 150. The package substrate 100 may include an open hole 114 into which the thermistor 120 may be inserted. The resistor 130 may be embedded in the through hole 104' of the package substrate 100 or surface-mounted on the semiconductor chip 150 or the package substrate 100. According to an example embodiment, as shown in FIG. 4F, the thermistor 120 is near the semiconductor chip 150, in order to more directly measure the temperature of the semiconductor chip 150. The open hole 114 may allow an easy approach to the thermistor 120, and thus the thermistor 120 may be easily replaced.

Figure 4G:
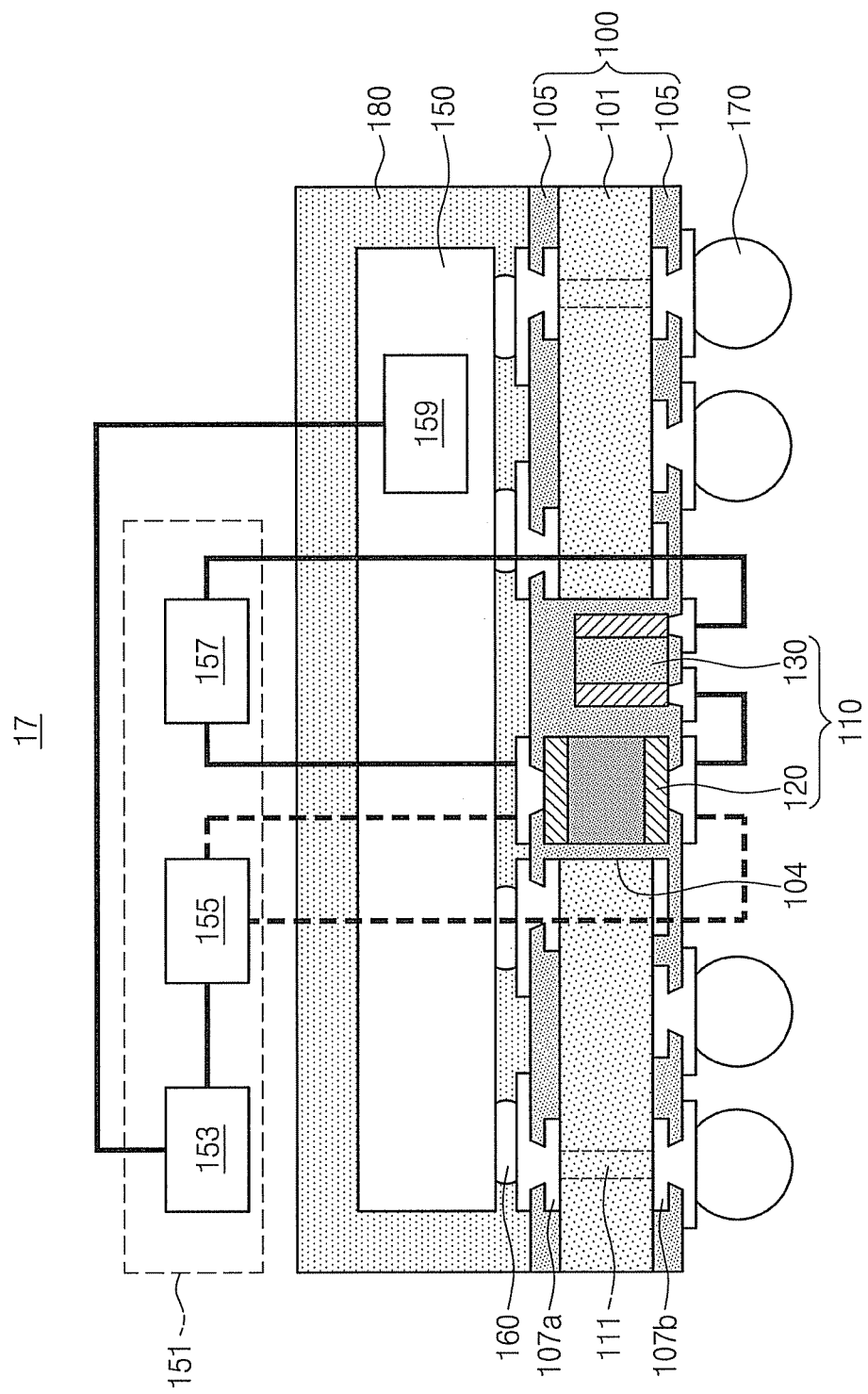

Referring to FIG. 4G, a semiconductor package 17 may include the semiconductor chip 150 without the built-in temperature control circuit 151. The temperature control circuit 151 may be disposed outside the semiconductor package 17, for example, at a board 200 of FIG. 5A on which the semiconductor package 17 is mounted. As another example, at least one of the processing unit 153, the conversion unit 155, and the power unit 157 in the temperature control circuit 151 may be embedded in the semiconductor chip 150, and the others may be disposed outside the semiconductor package 17.

Figure 4H:
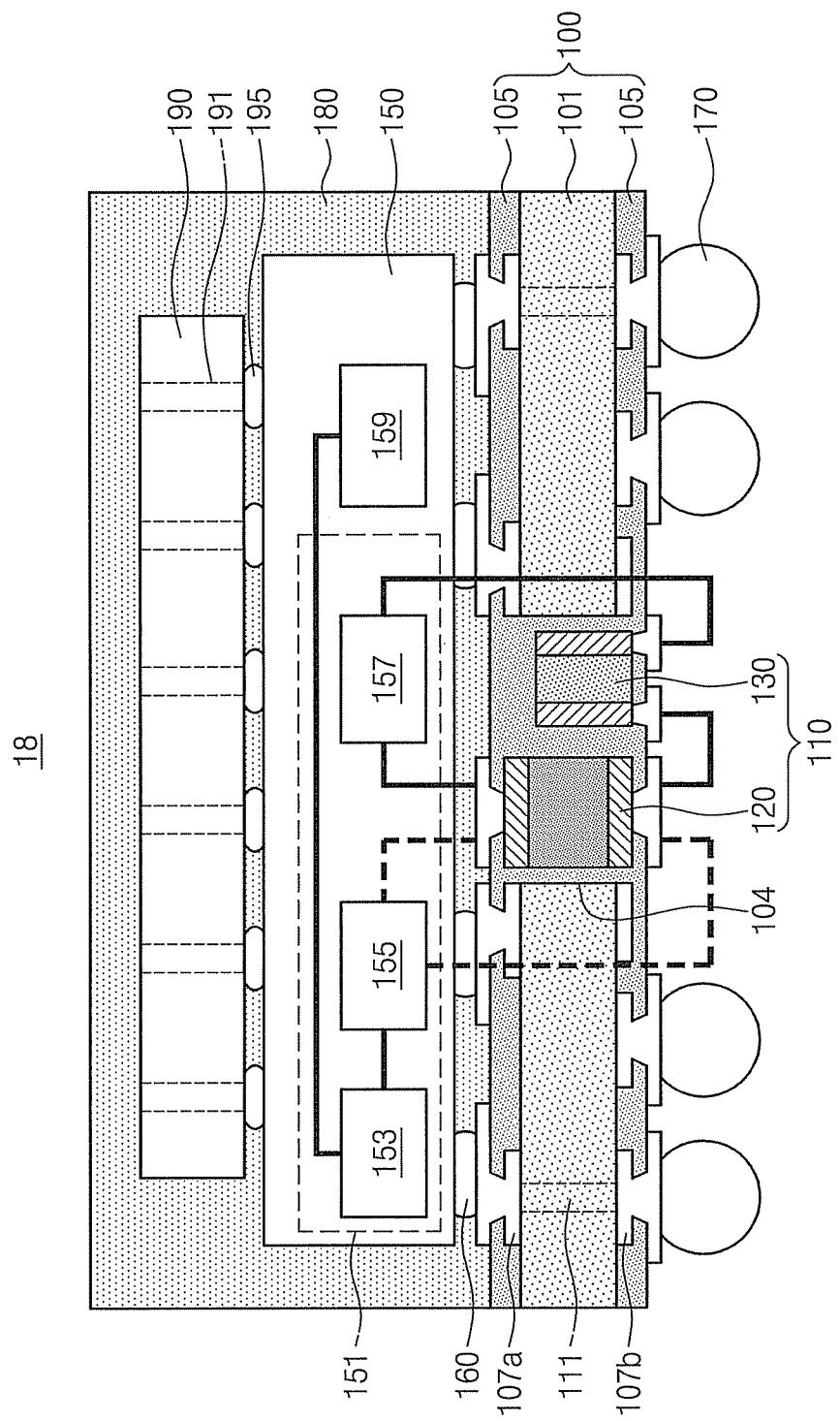

Referring to FIG. 4H, a semiconductor package 18 may be a multi-chip package in which another semiconductor chip 190 is mounted on the semiconductor chip 150. As an example, the semiconductor chip 150 may be a logic chip such as a central processing unit (CPU), and the semiconductor chip 190 may be a memory chip such as a DRAM, SRAM, NAND or NOR flash, or combination thereof. For example, the semiconductor chip 190 may be electrically connected with the semiconductor chip 150 through a medium of a solder bump 195 on the semiconductor chip 150. The semiconductor chip 190 may include a through electrode 191 and be flip-chip bonded on the semiconductor chip 150. As another example, the semiconductor chip 190 may be mounted face up on the semiconductor chip 150, and electrically connected with the semiconductor chip 150 or package substrate 100 through a through electrode 191 or bonding wire (not shown). According to an example embodiment, the thermistor 120 may measure temperatures of the semiconductor chips 150 and 190, and the temperature control circuit 151 may independently or in unison control the operation speeds of the semiconductor chips 150 and 190 on the basis of the measured temperature of the thermistor 120.

Referring to FIG. 4I, a semiconductor package 19 may further include a heat spreader 200 configured to dissipate heat generated in the semiconductor chip 150 to outside. The heat spreader 200 may be disposed between the semiconductor chip 150 and the molding layer 180. As an example, the heat spreader 200 may be a metal (for example, copper or aluminum, but example embodiments are not limited thereto) having a curved-plate shape suitable for surrounding the semiconductor chip 150, and the molding layer 180 may cover the heat spreader 200. Generally, heat may move along the heat spreader 200 and be dissipated through the package substrate 100. The heat spreader 200 may be extended to be connected to an upper metal layer 107a. A heat via 211, which connects the upper metal layer 107a connected to the heat spreader 200 with a lower metal layer 107b to provide a heat dissipating path, may be further provided to the package substrate 100. The heat spreader 200 may dissipate heat generated in the semiconductor chip 150 to reduce the semiconductor package 19 from being heated to over a reference temperature and also reduce its warpage. As another example, the heat spreader 200 may not be extended to the package substrate 100, and heat delivered to the heat spreader 200 may be dissipated outside the semiconductor package 19 without passing through the package substrate 100.

Referring to FIG. 4J, a semiconductor package 20 may include a heat spreader 220 adhered to a top surface of the semiconductor chip 150. The heat spreader may include a plate 220a horizontally extended along the top surface of the semiconductor chip 150 and a plurality of dissipation pins 220b vertically projecting from the plate 220a. The heat spreader 220 may have a surface area increased by the plurality of dissipation fins 220b, thereby having an excellent dissipation property. The molding layer 180 may be an exposed molding layer which is formed to expose the top surface of the semiconductor chip 150 and have the same level as the top surface of the semiconductor chip 150. An adhesive layer 222 such as a thermal interface material (TIM) may be further disposed between the semiconductor chip 150 and the heat spreader 220.

Figure 4K:
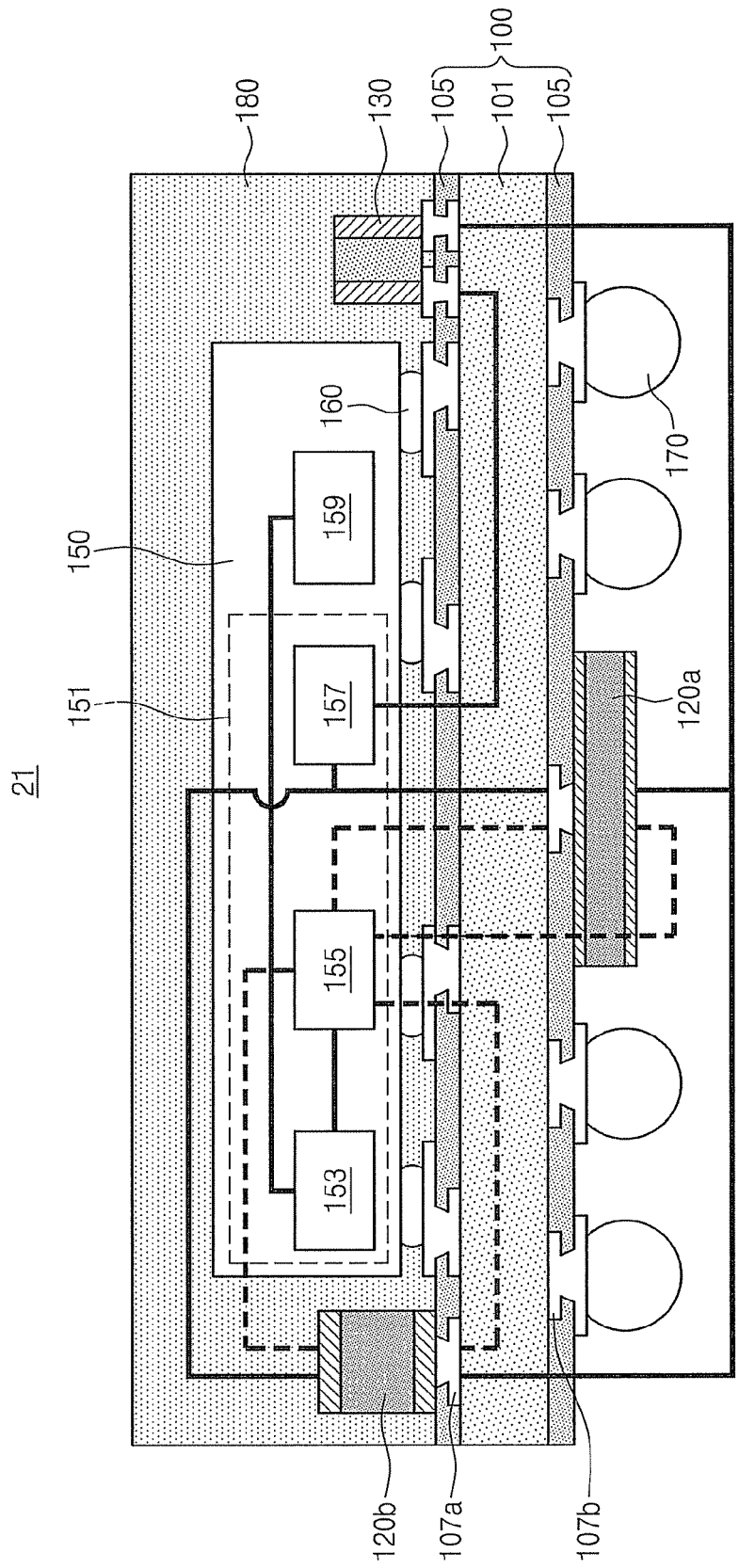
Figure 4L:
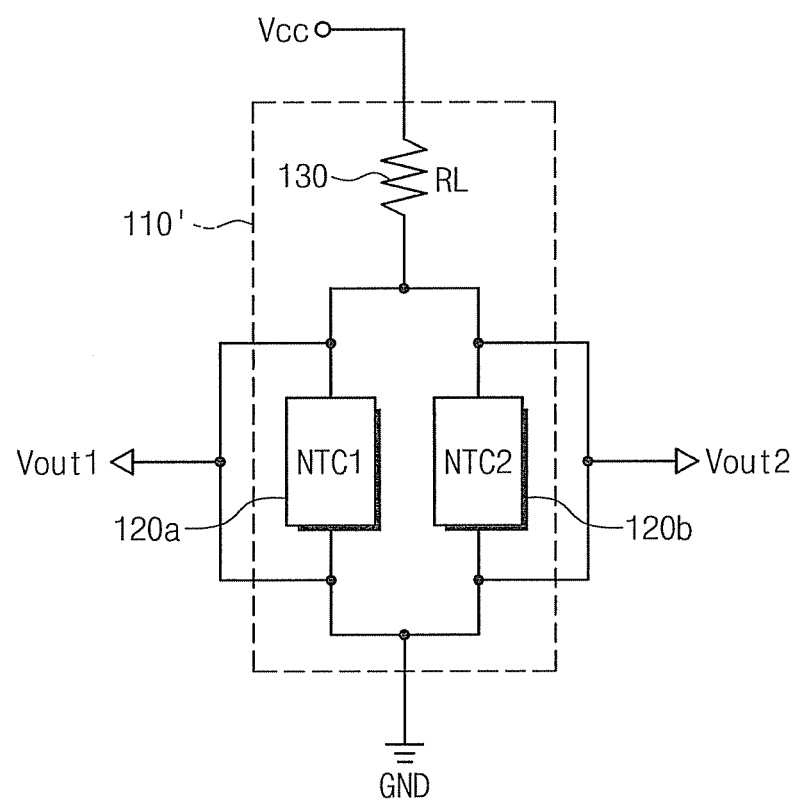
FIG. 4L is an equivalent circuit diagram illustrating a portion of FIG. 4K.

Referring to FIG. 4K, a semiconductor package 21 may include the resistor 130 and thermistors 120a and 120b surface-mounted on the package substrate 100. The thermistors 120a and 120b may be surface-mounted on the package substrate 100, and thus may be much more affected by the external environments in comparison with a case of being embedded. Accordingly, in order to minimize an error in the temperature measurement of the semiconductor chip 150, the thermistors 120a and 120b may be surface-mounted on the top and bottom surfaces of the package substrate 100, respectively.

As an example, a first thermistor 120a may be surface-mounted on the bottom surface of the package substrate 100 to measure the temperature of the semiconductor chip 150 delivered through the package substrate 100, and a second thermistor 120b may be surface-mounted on the top surface of the package substrate 100 to measure the temperature of the semiconductor chip 150 delivered through the molding layer 180 and/or the package substrate 100. The second thermistor 120b may be surface-mounted near the semiconductor chip 150 on the top of the package substrate 100. As another example, one of first and second thermistors 120a and 120b may be surface-mounted on the top or bottom surface of the package substrate 100, and the other may be surface-mounted on the semiconductor chip 150.

The resistor 130 may be surface-mounted on or embedded in the package substrate 100. A plurality (for example, 2) of resistors 130 may be provided to be independently connected with the thermistors 120a and 120b, or as shown in FIG. 4K according to an example embodiment, one resistor 130 may be provided to be connected with all the thermistors 120a and 120b.

Referring to FIGS. 4L and 4K, the temperature measurement device 110' in which two thermistors 120a and 120b are connected in parallel with one resistor 130 may be electrically connected to the power unit 157 to receive a source voltage Vcc. The first thermistor 120a and second thermistor 120b may output a first output voltage Vout1 and second output voltage Vout2, respectively. The temperature control circuit 151 may control an operation speed of the heating source 159 on the basis of the output voltage among the first output voltage Vout1 and second output voltage Vout2 that represents a higher temperature.

Cell Phone Module According to Some Example Embodiments

Figure 5A:
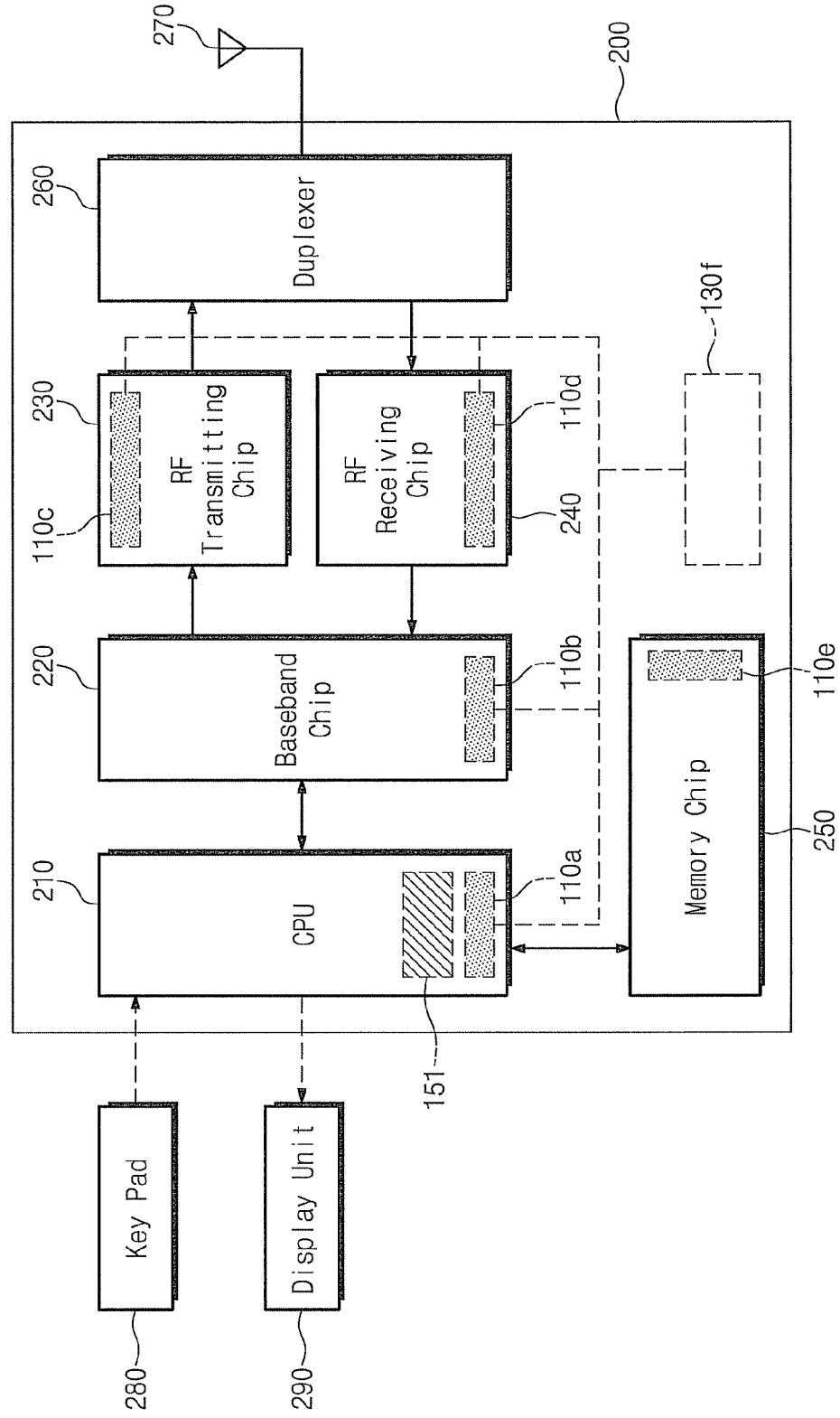
FIG. 5A is a block diagram illustrating a cell phone module including a semiconductor package according to an example embodiment of the inventive concepts.
Figure 5B:
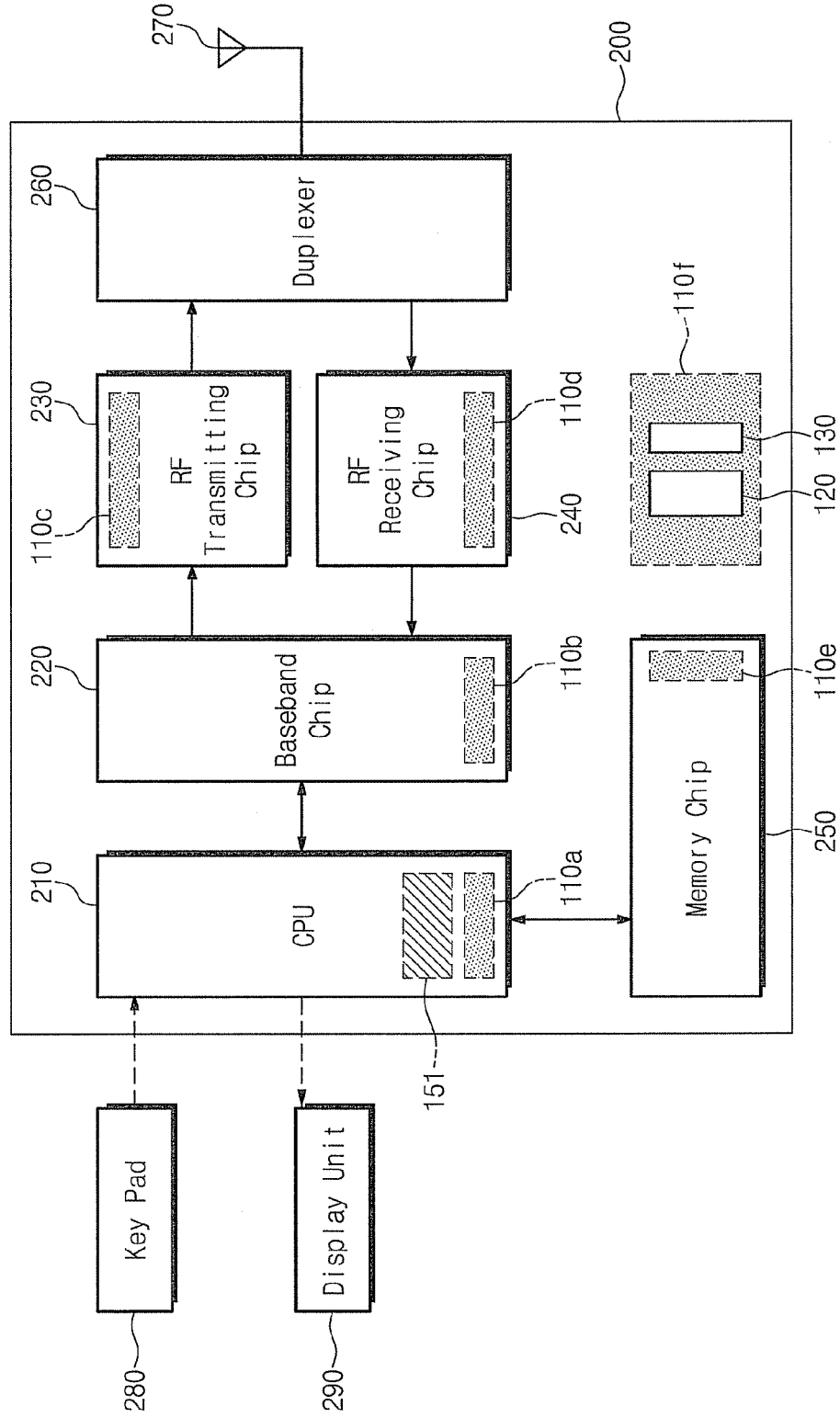
FIG. 5B is a block diagram illustrating a modified example of FIG. 5A.

FIG. 5A is a block diagram illustrating a cell phone module including a semiconductor package according to an example embodiment of the inventive concepts. FIG. 5B is a block diagram illustrating a modified example of FIG. 5A according to another example embodiment of the inventive concepts.

Referring to FIG. 5A, a cell phone module 1 may include a central processing unit 210, a baseband chip 220, a radio frequency transmitting chip 230, a radio frequency receiving chip 240, and a memory chip 250. All the chips 210 to 250 may be mounted on a surface or both surfaces of a module substrate 200. The central processing unit 210 may mainly perform a function of generating and analyzing a signal (for example, CDMA signal) to be transmitted to and/or received from a base station when making a phone call and/or using a wireless interne. In addition, the central processing unit 210 may perform various tasks such as audio and video functions for multimedia. Also, the central processing unit 210 may receive a key input signal output from a key pad 280 and control a display unit 290 such as a liquid crystal display (LCD) for visually displaying a state or operation process of a cell phone. The memory chip 250 may include a memory (for example, NAND flash or SDRAM, but example embodiments are not limited thereto) for storing a program needed for controlling the operation of the central processing unit 210. The memory may store information such as but not limited to a phone number, name, audio file, and video file, etc. The radio frequency transmitting chip 230 and radio frequency receiving chip 240 may transmit/receive a radio frequency signal to/from a base station through an antenna 270. A duplexer 260 separating transmitting/receiving frequencies may be further included. The baseband chip 220 may be responsible for digital signal processing and call processing.

The all chips 210 to 250 may be mounted on the module substrate 200 to be packaged identically or similarly to one of the semiconductor packages 10 to 21 described above. As an example, identically or similarly to the semiconductor package of FIG. 1A, the central processing unit 210 may include a temperature control circuit 151 and temperature measurement device 110a, and the other chips 220 to 250 may include temperature measurement devices 110b to 110e. The respective temperature measurement devices 110a to 110e may include the thermistor 120 and resistor 130 as illustrated in FIG. 1A.

As another example, the temperature measurement device 110a of the central processing unit 210 may include the thermistor 120 and the resistor 130, and the respective temperature measurement devices 110b to 110e of the other chips 220 to 250 may include the thermistor 120 but may not include the resistor 130. In this case, the thermistors 120 of the chips 220 to 250 may be connected to the resistor 130 of the central processing unit 210 in common. As another example, the respective temperature measurement devices 110a to 110e of the chips 210 to 250 may include the thermistors 120 but may not include the resistor 130. A resistor 130f may be disposed at the module substrate 200 to be connected to the thermistors 120 of the respective chips 210 to 250 in common. As another example, the temperature control circuit 151 and temperature measurement device 110a may not be disposed in the central processing unit 210, but embedded in or surface-mounted on the module substrate 200.

According to an example embodiment, the temperature of the cell phone module 1 may be controlled at a chip level. For example, when one of the chips 210 to 250, for example, the central processing unit 210 is overheated over a reference temperature, the temperature control circuit 151 may decrease the temperature of the central processing device 210 by decreasing its operation speed. As another example, when the cell phone module 1 is overheated due to multi-tasking of the cell phone, a specific function may be stopped. As an example, when the temperature of the cell phone module 1 rises abnormally while an audio file (for example, MP3) stored in the memory chip 250 is replayed, the temperature control circuit 151 may prevent the overheating by pausing a communicating function.

Referring to FIG. 5B, a cell phone module 2 may include a module substrate 200 including the temperature measurement device 110f. Other than this, the cell phone module 2 may be the same as (or substantially similar) to the cell phone module 1 of FIG. 5A. For example, the central processing unit 210 may include the temperature control circuit 151 and temperature measurement device 110a, and the other chips 220 to 250 may include the temperature measurement devices 110b to 110e. The respective temperature measurement devices 110a to 110e may include the thermistors 120 and resistor 130 identically or similarly to that of FIG. 1A, or may include the thermistors 120 but may not include the resistor 130. The temperature measurement device 110f disposed in the module substrate 200 may include the thermistor 120 and resistor 130, at least one of the thermistor 120 and resistor 130 may be embedded in or surface-mounted on the module substrate 200. The temperature measurement device 110f may be disposed near a position where heat is relatively more generated, for example, the central processing unit 210, baseband chip 220, and/or memory chip 250.

According to an example embodiment, as shown in FIG. 5B, the temperature of the cell phone module 2 may be controlled at a module level in addition to at a chip level. As an example, the temperature control circuit 151 of the central processing unit 210 may operate to control operation speeds of the all chips 220 to 250 on the basis of the temperature measured by the temperature measurement device 110f, thereby controlling the temperature of the module substrate 200. As described in detail in FIG. 5A, temperature control at a chip level may be performed in addition to temperature control at a module level.

According to an example embodiment, the central processing unit 210 may include the temperature control circuit 151 and temperature measurement device 110a, but other chips 220 to 250 may not include the temperature measurement devices 110b to 110e. In this case, a temperature of the cell phone module 2 may be controlled at a module level.

(Computer Board)

Figure 6A:
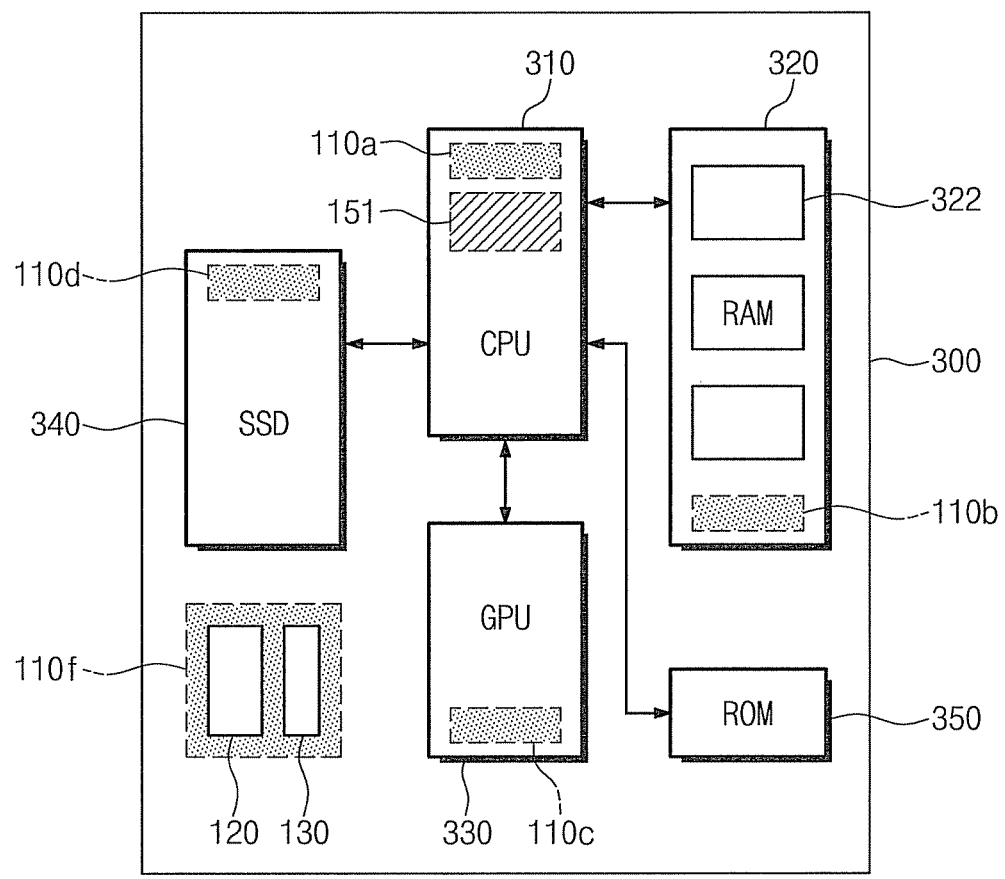
FIG. 6A is a block diagram illustrating a computer board including some semiconductor packages according to some example embodiments of the inventive concepts.
Figure 6B:
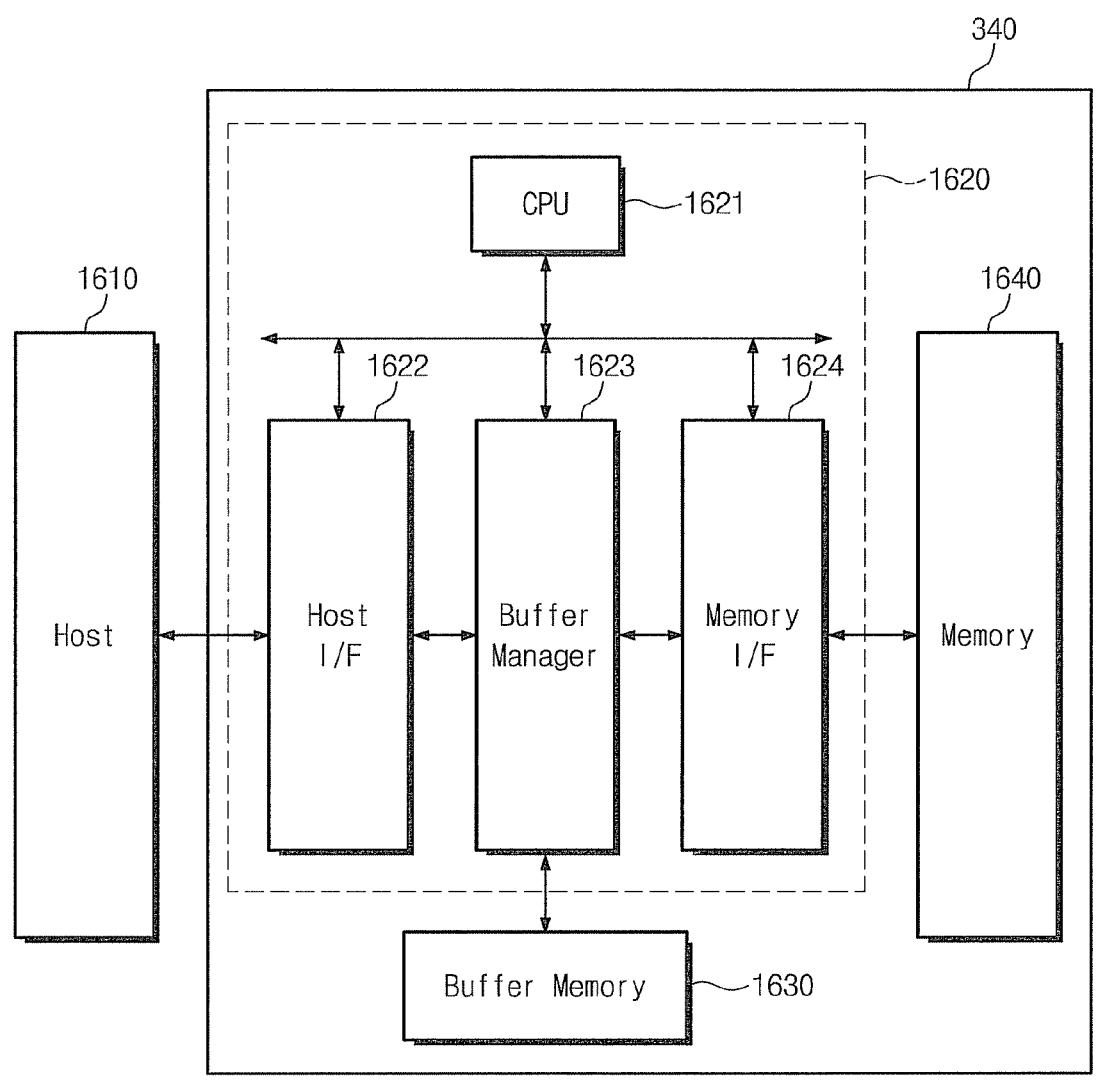
FIG. 6B is a block diagram illustrating a portion of FIG. 6A.

FIG. 6A is a block diagram illustrating a computer board including a semiconductor package according to an example embodiment of the inventive concepts. FIG. 6B is a block diagram illustrating a portion of FIG. 6A.

Referring to FIG. 6A, a computer board 3 may include a central processing unit 310 mounted on a main board 300 and controlling entire operations of a computer, a memory module 320 including at least one memory chip 322 providing a main memory, a graphic chip 330 responsible for graphic processing, a storage device 340 providing an assistant memory, and a ROM chip 350 controlling access to a basic hardware (for example, keyboard, monitor, or storage device) of the computer.

The devices 310 to 340 may be packaged identically or similarly to one of the semiconductor packages 10 to 21 described above. As an example, the central processing unit 310 may include the temperature control circuit 151 and temperature measurement device 110a, and the other devices 320 to 340 may include the temperature measurement devices 110b to 110c. The temperature measurement device 110a of the central processing unit 310 may include the thermistor 120 and resistor 130 identically or similarly to that of FIG. 1A, and the respective temperature measurement devices 110b to 110c of the other chips 320 to 340 may include the thermistors 120 or the thermistors 120 and resistor 130. In the above example, temperature control may be individually performed for each of the devices 310 to 340.

As another example, the temperature measurement device 110f including the thermistors 120 and resistor 130 may be embedded in or surface-mounted on the main board 300. In this case, temperature control may be individually performed for each of the devices 310 to 340 and/or main board 300.

The storage device 340 may adopt a hard disk drive (HDD), or a solid state disk (SSD) as in this embodiment of the inventive concepts. The SSD 340 will be described with reference to FIG. 6B.

Referring to FIG. 6B, the SSD 340 may include an SSD controller 1620, a buffer memory 1630, and a memory device 1640. The SSD 340 may be interfaced with a host 1610. The SSD controller 1620 may include a central processing unit 1621, a host interface 1622, a buffer manager 1623, and a memory interface 1624.

The central processing unit 1621 may deliver various control signals required for read/write operations to the host 1610 and memory interface 1624 according to firmware for driving the SSD 340, and perform an access operation to the buffer memory 1630 or memory device 1640. The host interface 1622 may provide a physical connection with the host 1610 and SSD 340. The buffer manager 1623 may control write/read operations of the buffer memory 1630. For example, the buffer memory 1630 may include a synchronous DRAM for providing a sufficient buffering space. The memory device 1640 may include a non-volatile memory for providing a storage space, for example, a NAND flash memory, NOR flash memory, PRAM, MRAM, or ReRAM. The memory device 1640 may be a data or code storage memory. When the memory device 1640 is a code storage memory, the SSD 340 may operate by itself without the input from the host 1610. The memory interface 1624 may exchange data with the memory device 1640 according to the control of the central processing unit 1621. The SSD 340 may include a multimedia card (MMC), security digital (SD) card, memory stick, ID card, or smart card.

According to some example embodiments of the inventive concepts, the thermistor being a temperature sensor may be embedded in the package substrate, and the resistor for preventing the thermistor from being heated may be further included, thereby measuring the temperature of the semiconductor package more accurately and exactly. In addition, the temperature control circuit may be built in the semiconductor chip, thereby measuring the temperature of the semiconductor package by the self operation of the semiconductor package. Thus, the semiconductor package with a reduced size and excellent reliability can be implemented.

While example embodiments have been particularly shown and described, it will be understood by one of ordinary skill in the art that variations in form and detail may be made therein. The above-disclosed subject matter is to be considered illustrative and not restrictive, and the appended claims are intended to cover all such modifications, enhancements, and other embodiments, which fall within the true spirit and scope of example embodiments of the inventive concepts. Thus, to the maximum extent allowed by law, the scope of example embodiments of the inventive concepts is to be determined by the broadest permissible interpretation of the following claims and their equivalents, and shall not be restricted or limited by the foregoing detailed description.

What is claimed is:

1. A semiconductor device comprising:
a semiconductor package including,
  a semiconductor chip mounted on a package substrate,
  a temperature measurement device configured to measure a temperature of the semiconductor package; and
  a temperature control circuit configured to receive from the temperature measurement device a signal corresponding to the temperature of the semiconductor package,
  the temperature control circuit configured to change an operation speed of the semiconductor chip on the basis of the signal.

2. The semiconductor device of claim 1, wherein
the temperature measurement device is embedded in the package substrate, and
the temperature control circuit is built in the semiconductor chip.

3. The semiconductor device of claim 2, wherein the temperature measurement device comprises:
a thermistor in the package substrate,
  the thermistor including a resistance that varies with temperature,
  the thermistor configured to measure the temperature of the semiconductor package; and
a resistor electrically connected to the thermistor.

4. The semiconductor device of claim 3, wherein the temperature control circuit comprises:
a power unit electrically connected to the resistor,
  the power unit configured to supply a source voltage to the temperature measurement device;
a conversion unit electrically connected to the thermistor,
  the conversion unit configured to convert an analog signal output received from the thermistor to a digital signal; and
a processing unit electrically connected to the conversion unit,
  the processing unit configured to receive the digital signal,
  the processing unit configured to change a power applied to the semiconductor chip on the basis of the digital signal.

5. The semiconductor device of claim 1, further comprising:
a heat spreader configured to dissipate heat generated in the semiconductor chip away from the semiconductor chip.

6. The semiconductor device of claim 1, wherein the semiconductor chip comprises:
a logic chip including the temperature control circuit; and
a memory chip mounted on the logic chip;
wherein the temperature control circuit is configured to change an operation speed of the logic chip and to change an operation speed of the memory chip.

7. A semiconductor device comprising:
a semiconductor chip mounted on a package substrate;
a thermistor configured to sense a temperature of the semiconductor chip and to output an output voltage corresponding to the temperature of the semiconductor chip;
a resistor connected to the thermistor;
a power unit included in the semiconductor chip,
  the power unit configured to apply a source voltage to the resistor and the thermistor;
a conversion unit included in the semiconductor chip,
  the conversion unit configured to convert the output voltage from the thermistor into a bit signal; and
a processing unit included in the semiconductor chip,
  the processing unit configured to receive the bit signal,
  the processing unit configured to change an operation speed of the semiconductor chip on the basis of the bit signal.

8. The semiconductor device of claim 7, wherein
the processing unit is configured to increase the operation speed of the semiconductor chip if the processing unit determines the bit signal indicates the temperature of the semiconductor chip is lower than a reference temperature, and
the processing unit is configured to decrease the operation speed of the semiconductor chip if the processing unit determines the bit signal indicates the temperature of the semiconductor chip is higher than the reference temperature.

9. The semiconductor device of claim 7, wherein at least one of the thermistor and resistor is one of
(i) embedded in the package substrate,
(ii) mounted on the package substrate, and
(iii) surface-mounted on the semiconductor chip.

10. The semiconductor device of claim 7, wherein
the thermistor is mounted on a bottom surface of the package substrate,
a second thermistor is mounted on a top surface of the package substrate, and
the resistor is connected to the thermistor and the second thermistor.

11. The semiconductor device of claim 7, wherein
the package substrate defines a cavity on one of a top surface of the package substrate and a bottom surface of the package substrate, and
at least one of the thermistor and the resistor is in the cavity.

12. The semiconductor device of claim 7, wherein
the package substrate defines an open hole,
the open hole exposes a bottom of the semiconductor chip,
the thermistor is in the open hole, and
a solder bump connects the thermistor to the semiconductor chip.

13. The semiconductor device of claim 7, further comprising:
a molding layer on the semiconductor chip; and
a heat spreader between the molding layer and the semiconductor chip, the heat spreader configured to dissipate heat generated in the semiconductor chip.

14. The semiconductor device of claim 13, wherein
the heat spreader surrounds the semiconductor chip,
the heat spreader is connected to the package substrate, and
the package substrate defines a heat via that penetrates through the package substrate and connects to the heat spreader,
the heat via providing a dissipation path of the heat.

15. The semiconductor device of claim 7, further comprising:
a heat spreader on the semiconductor chip.

16. The semiconductor device of claim 7, further comprising:
a module substrate on which the package substrate is mounted;
a module thermistor configured to measure a temperature of the module substrate; and
a second resistor connected to the module thermistor.

17. The semiconductor package of claim 1, wherein
the temperature measurement device is embedded in the package substrate,
the temperature measurement device includes a negative temperature coefficient thermistor and
a resistor connected to the thermistor,
the resistor has a resistance that is constant regardless of temperature,
the temperature control circuit is included in the semiconductor chip, and
the temperature control circuit is configured,
to receive a resistance value from the negative temperature coefficient thermistor, and
to increase a power applied to the semiconductor chip on the basis of the resistance value and a reference resistance value.

18. The semiconductor device of claim 17, wherein
the temperature control circuit is configured to decrease the power if the resistance value of the negative temperature coefficient thermistor is lower than the reference resistance value.

19. The semiconductor device of claim 17, wherein the temperature control circuit comprises:
a power unit configured to apply a source voltage to the temperature measurement device;
an analog-digital converter electrically connected to the negative temperature coefficient thermistor,
the analog-digital converter configured to receive the resistance value of the negative temperature coefficient thermistor and to convert the resistance value to a digital signal; and
a processing unit electrically connected to the analog-digital converter,
the processing unit configured to receive the digital signal and to adjust the power applied to the semiconductor chip on the basis of the digital signal.

20. The semiconductor package of claim 1, wherein
the temperature measurement device is embedded in the package substrate,
the temperature measurement device includes a negative temperature coefficient thermistor
configured to sense a temperature of the semiconductor chip,
a resistance value of the thermistor corresponding to the temperature sensed,
the temperature measurement devices includes a resistor electrically connected to the thermistor,
the resistor having a resistance that is constant regardless of temperature,
the temperature control circuit is included in the semiconductor chip, and
the temperature control circuit is configured to decrease an operation speed of the semiconductor chip when the temperature sensed by the thermistor is higher than a reference temperature.

21. The semiconductor device of claim 20, wherein
the temperature control circuit is configured to increase the operation speed of the semiconductor chip if the temperature sensed by the thermistor is lower than the reference temperature.

22. The semiconductor device of claim 1, wherein the temperature measurement device is embedded in the package substrate,
the temperature measurement device includes a negative temperature coefficient thermistor connected to a resistor,
a resistance of the resistor is constant regardless of temperature,
the semiconductor chip includes the temperature control circuit as a built-in temperature control circuit including,
a power unit electrically connected to the temperature measurement device,
the power unit configured to apply a source voltage to the temperature measurement device,
an analog-digital converter electrically connected to the negative temperature coefficient thermistor,
the analog-digital converter configured to receive a resistance value of the negative temperature coefficient thermistor,
the analog-digital converter configured to convert the resistance value to a bit signal, and
a processing unit electrically connected to the analog-digital converter,
the processing unit configured to receive the bit signal;
a connection terminal between the package substrate and the semiconductor chip,
the connection terminal electrically connecting the semiconductor chip to the package substrate; and
a molding layer is on the semiconductor chip.

23. The semiconductor device of claim 22, wherein
the negative temperature coefficient thermistor includes a first resistance element between a first electrode and a second electrode,
the resistor includes a second resistance element between a third electrode and a fourth electrode, and
the second electrode is electrically connected in series to the third electrode.

24. The semiconductor device of claim 23, wherein
the fourth electrode is electrically connected to the power unit,
the resistor is configured to receive the source voltage from the power unit, and
the first electrode is grounded.

25. The semiconductor device of claim 23, wherein
the first electrode is electrically connected to the analog-digital converter, and
the analog-digital converter is configured to sense a resistance value of the negative temperature coefficient thermistor.

26. The semiconductor device of claim 22, wherein the package substrate includes:
a core including a top surface and a bottom surface;
an upper metal layer on the top surface, the upper metal layer is connected to the connection terminal;
a lower metal layer positioned on the bottom surface,
the lower metal layer is connected to an external terminal; and
a hole defined by the core,
the hole including a space in which the negative temperature coefficient thermistor and resistor are embedded.

27. The semiconductor device of claim 22, wherein
the negative temperature coefficient thermistor is configured to sense a temperature of the semiconductor chip, and
the negative temperature coefficient thermistor is configured to output to the analog-digital converter a resistance value corresponding to the sensed temperature.

28. The semiconductor device of claim 27, wherein
the processing unit is configured to receive the resistance value,
the processing unit is configured to increase a power applied to the semiconductor chip in order to increase an operation speed of the semiconductor chip if the resistance value is higher than a reference value, and
the processing unit is configured to decrease the power applied to the semiconductor chip in order to decrease the operation speed of the semiconductor chip if the resistance value is lower than the reference value.

29. The semiconductor package of claim 1, wherein
the temperature measurement circuit includes a thermistor connected to semiconductor package,
the temperature control circuit includes a processing unit,
the processing unit is configured to adjust a power supplied to the semiconductor chip based on output from the thermistor,
the processing unit is configured to adjust the power from a first power to a second power, both the first power and the second power being greater than 0 W.

30. The semiconductor package of claim 29, further comprising:
a resistor connected to the thermistor,
wherein the resistor includes,
a first electrode,
a second electrode, and
a resistive element between the first electrode and the second electrode.

31. The semiconductor package of claim 29 further comprising:
a conversion unit connecting the thermistor to the processing unit,
the conversion unit configured to convert the output of the thermistor into a digital signal,
the processing unit configured to receive the digital signal,
the processing unit being configured to increase the power supplied to the semiconductor chip if the processing unit determines the digital signal indicates the temperature of the semiconductor chip is lower than a desired temperature, and
the processing unit being configured to decrease the power supplied to the semiconductor chip if the processing unit determines the digital signal indicates the temperature of the semiconductor chip is higher than a desired temperature.

32. The semiconductor package of claim 29, further comprising:
a resistor connected to thermistor,
wherein at least one of the resistor and the thermistor are embedded in a substrate.

33. The semiconductor package of claim 29, further comprising:
a resistor connected to thermistor,
wherein at least one of the resistor and the thermistor are on a substrate.

34. The semiconductor package of claim 29, further comprising:
a resistor connected to thermistor,
wherein at least one of the resistor and the thermistor are on the semiconductor chip.

35. The semiconductor package of claim 1, wherein
the semiconductor chip includes a logic chip,
the temperature control circuit includes a processing unit configured to receive the signal from the temperature measurement device, and
the processing unit is configured to increase the operation speed of the semiconductor chip if the processing unit determines the signal indicates the temperature of the semiconductor package is lower than a reference temperature, and
the processing unit is configured to decrease the operation speed of the semiconductor chip if the processing unit determines the signal indicates the temperature of the semiconductor package is higher than the reference temperature.

* * * * *